United States Patent
Zhang et al.

(10) Patent No.: US 12,424,544 B2
(45) Date of Patent: Sep. 23, 2025

(54) THREE-DIMENSIONAL NAND MEMORY AND FABRICATION METHOD THEREOF

(71) Applicant: Yangtze Memory Technologies Co., Ltd., Hubei (CN)

(72) Inventors: Kun Zhang, Hubei (CN); Wenxi Zhou, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 518 days.

(21) Appl. No.: 17/703,004

(22) Filed: Mar. 24, 2022

(65) Prior Publication Data

US 2023/0069420 A1    Mar. 2, 2023

Related U.S. Application Data

(63) Continuation of application No. PCT/CN2021/114720, filed on Aug. 26, 2021.

(51) Int. Cl.
*H01L 23/528* (2006.01)
*H10B 43/27* (2023.01)

(52) U.S. Cl.
CPC ......... *H01L 23/5283* (2013.01); *H10B 43/27* (2023.02)

(58) Field of Classification Search
None
See application file for complete search history.

(56) References Cited

U.S. PATENT DOCUMENTS

| | | |
|---|---|---|
| 7,642,158 B2 | 1/2010 | Parascandola et al. |
| 7,679,137 B2 | 3/2010 | Lee et al. |
| 10,249,357 B1 * | 4/2019 | Lin .................. H10B 12/50 |
| 10,559,592 B1 | 2/2020 | Liu et al. |
| 2006/0223278 A1 * | 10/2006 | Kim ................ H01L 21/32139 |
| | | 257/E21.679 |

(Continued)

FOREIGN PATENT DOCUMENTS

| | | |
|---|---|---|
| CN | 1941356 A | 4/2007 |
| CN | 101281886 A | 10/2008 |

(Continued)

OTHER PUBLICATIONS

International Search Report of the International Searching Authority directed to related International Patent Application No. PCT/CN2021/114720, mailed May 25, 2022; 5 pages.

*Primary Examiner* — Nishath Yasmeen
(74) *Attorney, Agent, or Firm* — Conley Rose, P.C.

(57) ABSTRACT

The present disclosure provides a method for forming a three-dimensional (3D) memory device. The method includes forming an alternating dielectric stack on a substrate, wherein the alternating dielectric stack includes a plurality of dielectric layer pairs, each dielectric layer pair comprising a first dielectric layer and a second dielectric layer different from the first dielectric layer. The method also includes forming a staircase structure in the alternating dielectric stack and disposing an insulating layer on the staircase structure and the alternating dielectric stack. The method further includes forming an embedded hard mask on the insulating layer, wherein the embedded hard mask includes two or more sets of patterns configured to form two or more sets of vertical structures that are fabricated sequentially. The two or more sets of patterns are embedded in the 3D memory device.

15 Claims, 29 Drawing Sheets

(56) References Cited

U.S. PATENT DOCUMENTS

| | | | | |
|---|---|---|---|---|
| 2016/0093524 A1* | 3/2016 | Izumi | ................. | H10B 43/27 |
| | | | | 438/637 |
| 2016/0322374 A1* | 11/2016 | Sano | ................. | H01L 21/31051 |
| 2017/0148800 A1 | 5/2017 | Nishikawa et al. | | |
| 2021/0005627 A1 | 1/2021 | Hinoue et al. | | |
| 2021/0225866 A1 | 7/2021 | Lu et al. | | |
| 2021/0287991 A1* | 9/2021 | Sun | ................. | H10B 43/10 |
| 2022/0028890 A1 | 1/2022 | Xia et al. | | |
| 2022/0367808 A1* | 11/2022 | Kim | ................. | H10N 70/841 |
| 2023/0036595 A1* | 2/2023 | Thimmegowda | ...... | H10B 41/10 |

FOREIGN PATENT DOCUMENTS

| | | | | |
|---|---|---|---|---|
| CN | 106409833 A | 2/2017 | | |
| CN | 108389786 A | 8/2018 | | |
| CN | 109155319 A | 1/2019 | | |
| CN | 110741475 A | 1/2020 | | |
| CN | 111448648 A | 7/2020 | | |
| KR | 2009-0012831 A | 2/2009 | | |
| WO | WO 2019/095996 A1 | 5/2019 | | |
| WO | WO-2021155611 A1 * | 8/2021 | ......... | G11C 16/0466 |

\* cited by examiner

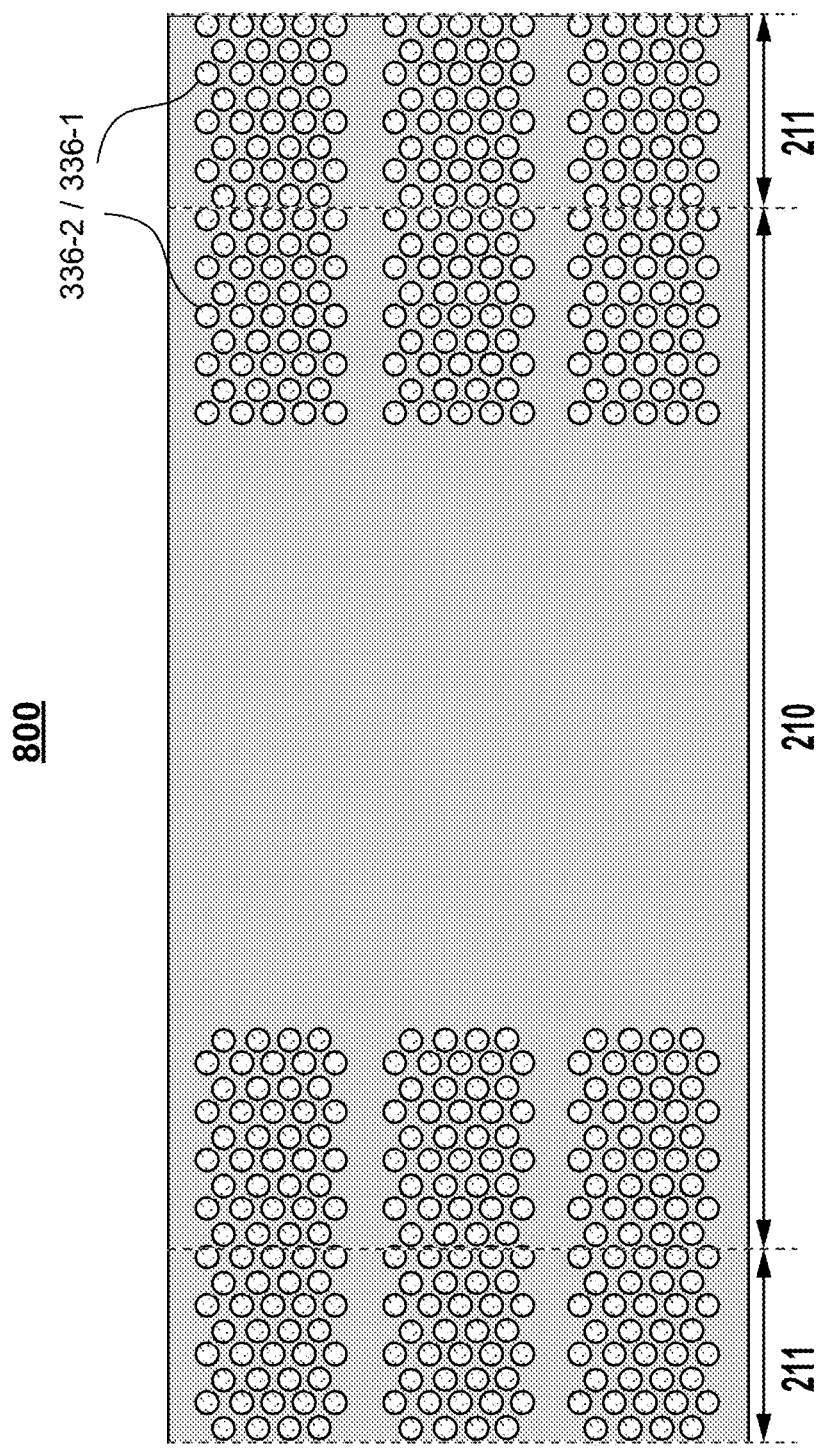

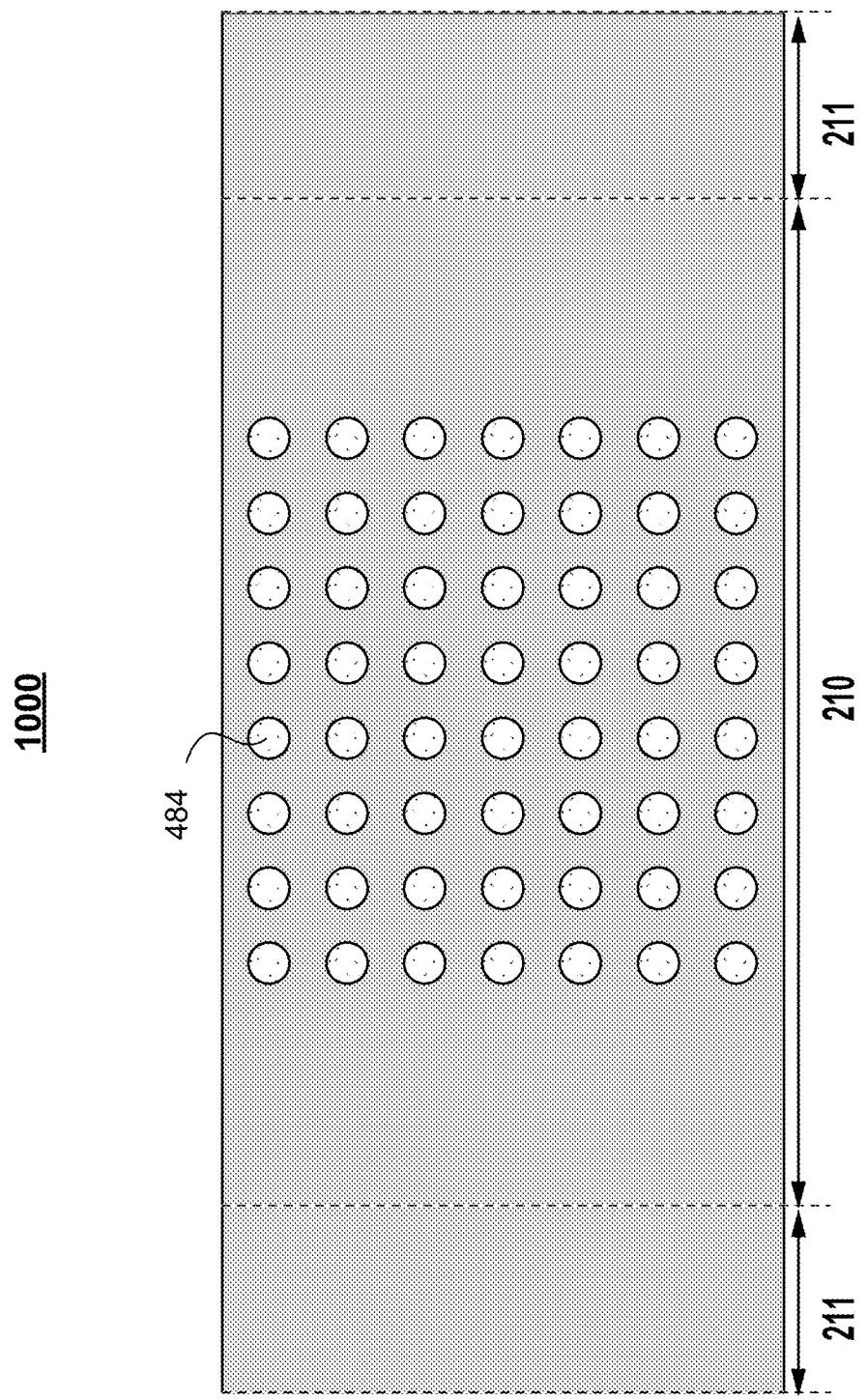

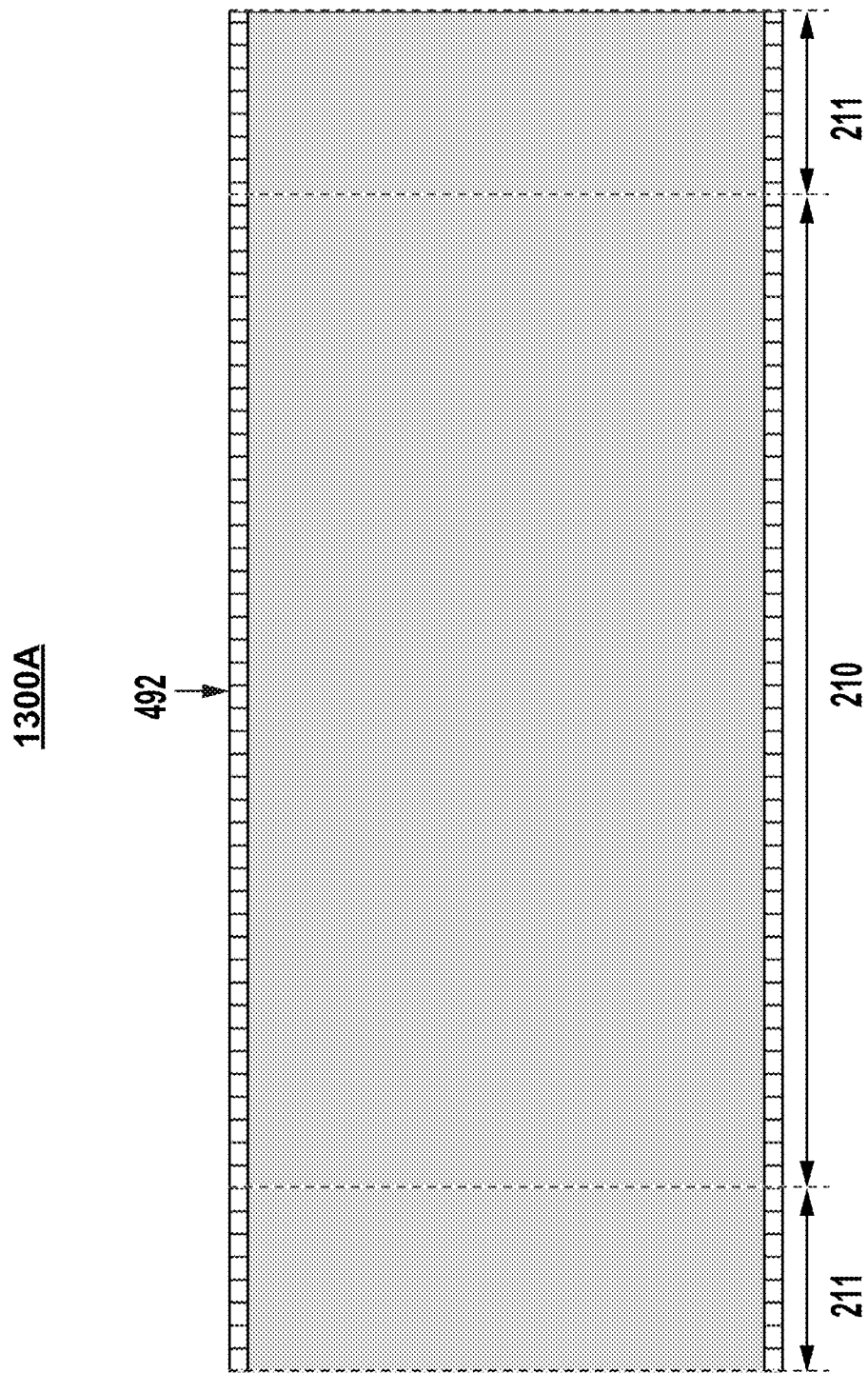

THREE-DIMENSIONAL NAND MEMORY AND FABRICATION METHOD THEREOF

INCORPORATION BY REFERENCE

This application claims priority to PCT/CN2021/114720 filed on Aug. 26, 2021, which is incorporated herein by reference in its entirety.

TECHNICAL FIELD

The present disclosure generally relates to the field of semiconductor technology, and more particularly, to a three-dimensional NAND flash memory and its fabrication methods.

BACKGROUND

As memory devices are shrinking to smaller die size to reduce manufacturing cost and increase storage density, scaling of planar memory cells faces challenges due to process technology limitations and reliability issues. A three-dimensional (3D) memory architecture can address the density and performance limitation in planar memory cells.

In a 3D NAND flash memory, many layers of memory cells can be stacked vertically such that storage density per unit area can be greatly increased. The number of vertically stacked layers can be greatly increased to further increase the storage capacity. However, a high aspect ratio structure can be very challenging to fabricate, for example, etching through the entire vertically stacked layers to form the channel holes, gate line slits, word line (staircase) contacts, bit line contacts, dummy channel holes, etc. Additionally, precise alignment between these structures is very critical.

BRIEF SUMMARY

Embodiments of a three-dimensional (3D) memory device and a method for forming the same are described in the present disclosure.

One aspect of the present disclosure provides a method for forming a three-dimensional (3D) memory device. The method includes forming an alternating dielectric stack on a substrate, wherein the alternating dielectric stack includes a plurality of dielectric layer pairs, each dielectric layer pair comprising a first dielectric layer and a second dielectric layer different from the first dielectric layer. The method also includes forming a staircase structure in the alternating dielectric stack and disposing an insulating layer on the staircase structure and the alternating dielectric stack. The method further includes forming an embedded hard mask on the insulating layer, wherein the embedded hard mask includes multiple sets of patterns configured to form multiple sets of vertical structures that are fabricated sequentially. The two or more sets of patterns are embedded in the 3D memory device.

In some embodiments, the forming the embedded hard mask includes disposing a first dielectric material on the insulating layer; and etching the first dielectric material to form the two or more sets of patterns.

In some embodiments, the method further includes forming a sacrificial hard mask on the embedded hard mask, wherein the sacrificial hard mask includes a second dielectric material different from the first dielectric material.

In some embodiments, the forming the sacrificial hard mask includes disposing the second dielectric material on the embedded hard mask; and planarizing the second dielectric material to form a planar surface for the sacrificial hard mask.

In some embodiments, the forming the two or more sets of vertical structures includes etching, sequentially, the sacrificial hard mask to form two or more sets of openings, wherein the two or more set of openings are aligned with the two or more set of patterns in the embedded hard mask and the two or more sets of openings are wider than the two or more sets of patterns.

In some embodiments, the forming the two or more sets of vertical structures further includes forming two or more sets of vertical openings in the insulating layer, wherein the two or more sets of vertical openings are perpendicular to the substrate; and critical dimensions of the two or more sets of vertical openings are determined by the two or more sets of patterns in the embedded hard mask.

In some embodiments, the forming the two or more sets of vertical structures further includes forming a set of dummy channel holes (DCHs), which includes etching the sacrificial hard mask to form a first set of openings. The first set of openings are aligned with a first set of patterns among the two or more sets of patterns in the embedded hard mask; and the first set of openings in the sacrificial hard mask are wider than the first set of patterns in the embedded hard mask. The forming the set of DCHs also includes forming a set of DCH openings, among the two or more sets of vertical openings, by etching through the insulating layer, the staircase structure and a portion of the substrate. The forming the set of DCHs also includes disposing an insulating material inside the set of DCH openings.

In some embodiments, the forming the set of DCHs further comprises disposing a DCH resist mask and a DCH hard mask on the sacrificial hard mask; and patterning the DCH resist mask and the DCH hard mask to form the set of DCH openings.

In some embodiments, the DCH hard mask comprises a thickness in a range between 10 nm to 50 nm.

In some embodiments, the forming the two or more sets of vertical structures further includes forming a set of gate line slits (GLSs), which includes etching the sacrificial hard mask to form a second set of openings. The second set of openings are aligned with a second set of patterns among the two or more sets of patterns in the embedded hard mask; and the second set of openings in the sacrificial hard mask are wider than the second set of patterns in the embedded hard mask. The forming the set of GLSs also includes forming a set of GLS openings, among the two or more sets of vertical openings, by etching through the alternating dielectric stack. The forming the set of GLSs also includes replacing the second dielectric layers in the alternating dielectric stack with conductive layers to form a film stack of alternating conductive and dielectric layers; and disposing an insulating material inside the set of GLS openings.

In some embodiments, the forming the two or more sets of vertical structures further includes forming a set of staircase (SS) contacts, which includes etching the sacrificial hard mask to form a third set of openings. The third set of openings are aligned with a third set of patterns among the two or more sets of patterns in the embedded hard mask; and the third set of openings in the sacrificial hard mask are wider than the third set of patterns in the embedded hard mask. The forming the set of SS contacts also includes forming a set of SS contact openings, among the two or more sets of vertical openings, which includes etching through the insulating layer selectively to a barrier layer disposed on the staircase structure; and etching through the barrier layer to expose the conductive layers. The forming the set of SS contacts also includes disposing a conductive material inside the set of SS contact openings.

In some embodiments, the forming the two or more sets of vertical structures further includes forming a set of array common source (ACS) contacts, which includes forming a set of ACS contact openings among the two or more sets of vertical openings by etching into the substrate or a semiconductor layer disposed on the substrate; and disposing the conductive material inside the set of ACS contact openings.

In some embodiments, the forming the two or more sets of vertical structures further includes forming a set of bit line (BL) contacts, which includes etching the sacrificial hard mask to form a fourth set of openings, where the fourth set of openings are aligned with a fourth set of patterns among the two or more sets of patterns in the embedded hard mask; and the fourth set of openings in the sacrificial hard mask are wider than the fourth set of patterns in the embedded hard mask. The forming the set of BL contacts also includes forming a set of BL contact openings, among the two or more sets of vertical openings, by etching through the insulating layer and exposing top contact structures on top portions of a plurality of channel holes. The forming the set of BL contacts further includes disposing the conductive material inside the set of BL contact openings.

In some embodiments, the method for forming the 3D memory device further includes forming the plurality of channel holes penetrating vertically through the alternating dielectric stack, which includes disposing memory films on sidewalls of the plurality of channel holes; disposing channel layers on sidewalls of the memory films; and disposing core filling films on sidewalls of the channel layers.

In some embodiments, the forming the plurality of channel holes further includes disposing a lower alternating dielectric stack on the substrate; forming a plurality of lower channel holes in the lower alternating dielectric stack; disposing an upper alternating dielectric stack on the lower alternating dielectric stack; and forming a plurality of upper channel holes in the upper alternating dielectric stack, wherein the plurality of upper channel holes are aligned with the plurality of lower channel holes.

Another aspect of the present disclosure provides a three-dimensional (3D) memory device. The 3D memory device includes a film stack of alternating conductive and dielectric layers, having conductive layers and dielectric layers alternatingly stacked on a substrate. The 3D memory device also includes a staircase structure formed in the film stack, an insulating layer disposed over the staircase structure and the film stack; and an embedded hard mask disposed on the insulating layer and comprising two or more sets of patterns, wherein the two or more sets of patterns determine critical dimensions of two or more sets of vertical structures extending perpendicularly to the substrate. The two or more sets of patterns are embedded in the 3D memory device.

In some embodiments, the 3D memory device also includes a sacrificial hard mask disposed on the embedded hard mask. The sacrificial hard mask and the embedded hard mask comprise different dielectric materials. The sacrificial hard mask comprises two or more sets of openings aligned with the two or more sets of patterns in the embedded hard mask. The two or more sets of openings in the sacrificial hard mask are wider than the two or more sets of patterns in the embedded hard mask.

In some embodiments, the sacrificial hard mask comprises a thickness in a range between about 10 nm to 100 nm at a location above the embedded hard mask.

In some embodiments, the sacrificial hard mask comprises a thickness about 20 nm at a location above the embedded hard mask.

In some embodiments, the sacrificial hard mask comprises a thickness about 50 nm at a location above the embedded hard mask.

In some embodiments, the sacrificial hard mask comprises a thickness about 70 nm at a location above the embedded hard mask.

In some embodiments, the two or more sets of vertical structures comprise a "T" shape, wherein a head of the "T" shape is located at least in the sacrificial hard mask. In some embodiments, the head of the "T" shape extends into the embedded hard mask.

In some embodiments, the two or more sets of vertical structures extend through the two or more sets of openings in the sacrificial hard mask and the two or more sets of patterns in the embedded hard mask.

In some embodiments, the two or more sets of vertical structures include a set of dummy channel holes (DCHs). The set of DCHs penetrate through the insulating layer, the staircase structure and a portion of the substrate. The set of DCHs are filled with an insulating material.

In some embodiments, the two or more sets of vertical structures include a set of gate line slits (GLSs). The set of GLSs penetrate through the film stack of alternating conductive and dielectric layers. The set of GLSs are filled with an insulating material.

In some embodiments, the two or more sets of vertical structures include a set of staircase (SS) contacts. The set of SS contacts penetrate through the insulating layer and connect to the conductive layers of the film stack. The set of SS contacts are filled with a conductive material.

In some embodiments, the two or more sets of vertical structures include a set of array common source (ACS) contacts. The set of ACS contacts penetrate through the insulating layer and extend into the substrate or a semiconductor layer disposed on the substrate. The set of ACS contacts are filled with a conductive material.

In some embodiments, the two or more sets of vertical structures include a set of bit line (BL) contacts. The set of BL contacts penetrate through the insulating layer and connect to top contact structures on top portions of a plurality of channel holes. The set of BL contacts are filled with a conductive material.

In some embodiments, the plurality of channel holes penetrate vertically through the film stack. Each channel hole includes a core filling film located in a center of the channel hole; a channel layer surrounding the core filling film; and a memory film surrounding the channel layer.

In some embodiments, the film stack includes a lower stack and an upper stack. The lower stack is disposed on the substrate and includes a first channel hole. The first channel hole penetrates vertically through the lower stack. The upper stack is disposed on the lower stack and comprises a second channel hole. The second channel hole penetrates vertically through the upper stack and is aligned with the first channel hole in the lower stack.

In some embodiments, the embedded hard mask includes a thickness in a range between 10 nm to 1000 nm.

In some embodiments, the embedded hard mask includes a thickness about 50 nm.

In some embodiments, the embedded hard mask includes a thickness about 100 nm.

In some embodiments, the embedded hard mask includes a thickness about 300 nm.

In some embodiments, the two or more sets of patterns have different critical dimensions and shapes.

Yet another aspect of the present disclosure provides a three-dimensional (3D) memory device. The 3D memory device includes a film stack of alternating conductive and dielectric layers, including conductive layers and dielectric layers alternatingly stacked on a substrate. The 3D memory device also includes a staircase structure formed in the film stack; an insulating layer disposed over the staircase structure and the film stack; and an embedded hard mask disposed on the insulating layer and comprising two or more sets of patterns. The two or more sets of patterns determine critical dimensions of two or more sets of vertical structures extending perpendicularly to the substrate. The 3D memory device further includes a sacrificial hard mask disposed on the embedded hard mask.

In some embodiments, the sacrificial hard mask and the embedded hard mask include different dielectric materials. The sacrificial hard mask includes two or more sets of openings aligned with the two or more sets of patterns in the embedded hard mask. The two or more sets of openings in the sacrificial hard mask are wider than the two or more sets of patterns in the embedded hard mask.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIGS. 8A and 8B illustrate a cross-sectional view and a top-down view of the 3D memory device in FIG. 4A at certain process step, respectively, according to some embodiments of the present disclosure.

FIGS. 10A and 10B illustrate a cross-sectional view and a top-down view of the 3D memory device in FIG. 4A at certain process step, respectively, according to some embodiments of the present disclosure.

FIGS. 13A and 13B illustrate a cross-sectional view and a top-down view of the 3D memory device in FIG. 4A at certain process step, respectively, according to some embodiments of the present disclosure.

Figure 1:
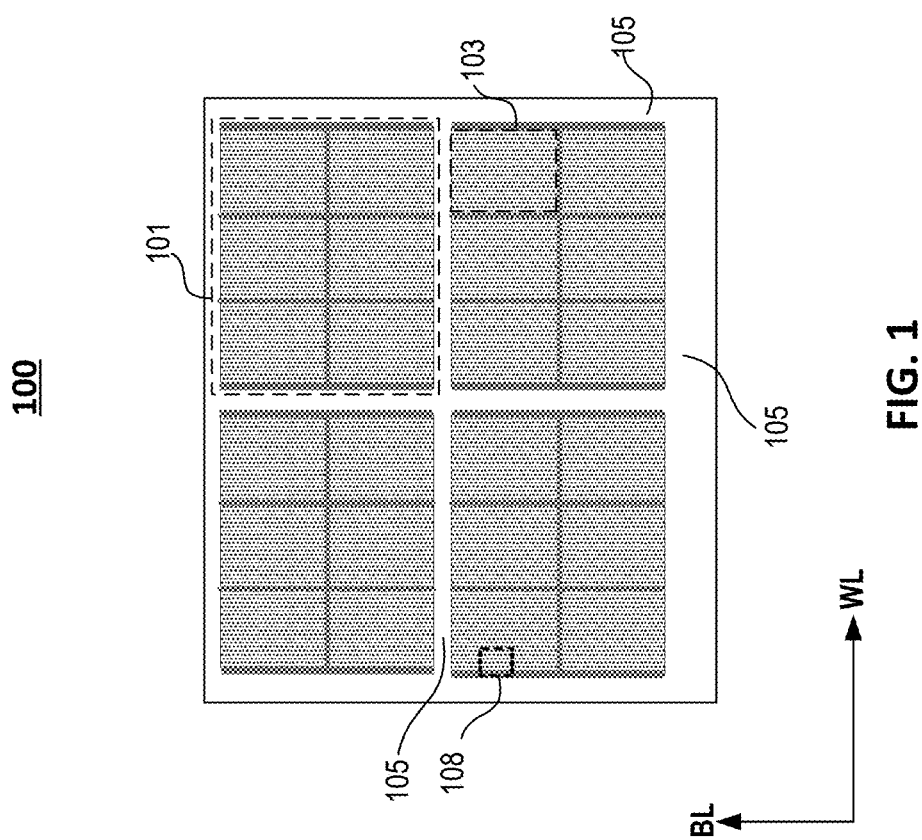
FIG. 1 illustrates a schematic top-down view of an exemplary three-dimensional (3D) memory die, according to some embodiments of the present disclosure.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer there between. Moreover, "above" or "over" not only means "above" or "over" something, but can also include the meaning it is "above" or "over" something with no intermediate feature or layer there between (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, there above, and/or there below. A layer can include multiple layers. For example, an interconnect layer can include one or more conductive and contact layers (in which contacts, interconnect lines, and/or vertical interconnect accesses (VIAs) are formed) and one or more dielectric layers.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate.

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate.

FIG. 1 illustrates a top-down view of an exemplary three-dimensional (3D) memory device 100, according to some embodiments of the present disclosure. The 3D memory device 100, such as 3D NAND Flash memory, can be a memory chip (package), a memory die or any portion of a memory die, and can include one or more memory planes 101, each of which can include a plurality of memory blocks 103. Identical and concurrent operations can take place at each memory plane 101. The memory block 103, which can be megabytes (MB) in size, is the smallest size to carry out erase operations. Shown in FIG. 1, the exemplary 3D memory device 100 includes four memory planes 101 and each memory plane 101 includes six memory blocks 103. Each memory block 103 can include a plurality of memory cells, where each memory cell can be addressed through interconnections such as bit lines and word lines. The bit lines and word lines can be laid out perpendicularly (e.g., in rows and columns, respectively), forming an array of metal lines. The direction of bit lines and word lines are labeled as "BL" and "WL" in FIG. 1. In this disclosure, memory block 103 is also referred to as a "memory array" or "array." The memory array is the core area in a memory device, performing storage functions.

The 3D memory device 100 also includes a peripheral region 105, an area surrounding memory planes 101. The peripheral region 105 contains many digital, analog, and/or mixed-signal circuits to support functions of the memory array, for example, page buffers, row and column decoders and sense amplifiers. Peripheral circuits use active and/or passive semiconductor devices, such as transistors, diodes, capacitors, resistors, etc., as would be apparent to a person of ordinary skill in the art.

It is noted that, the arrangement of the memory planes 101 in the 3D memory device 100 and the arrangement of the memory blocks 103 in each memory plane 101 illustrated in FIG. 1 are only used as an example, which does not limit the scope of the present disclosure.

Figure 2:
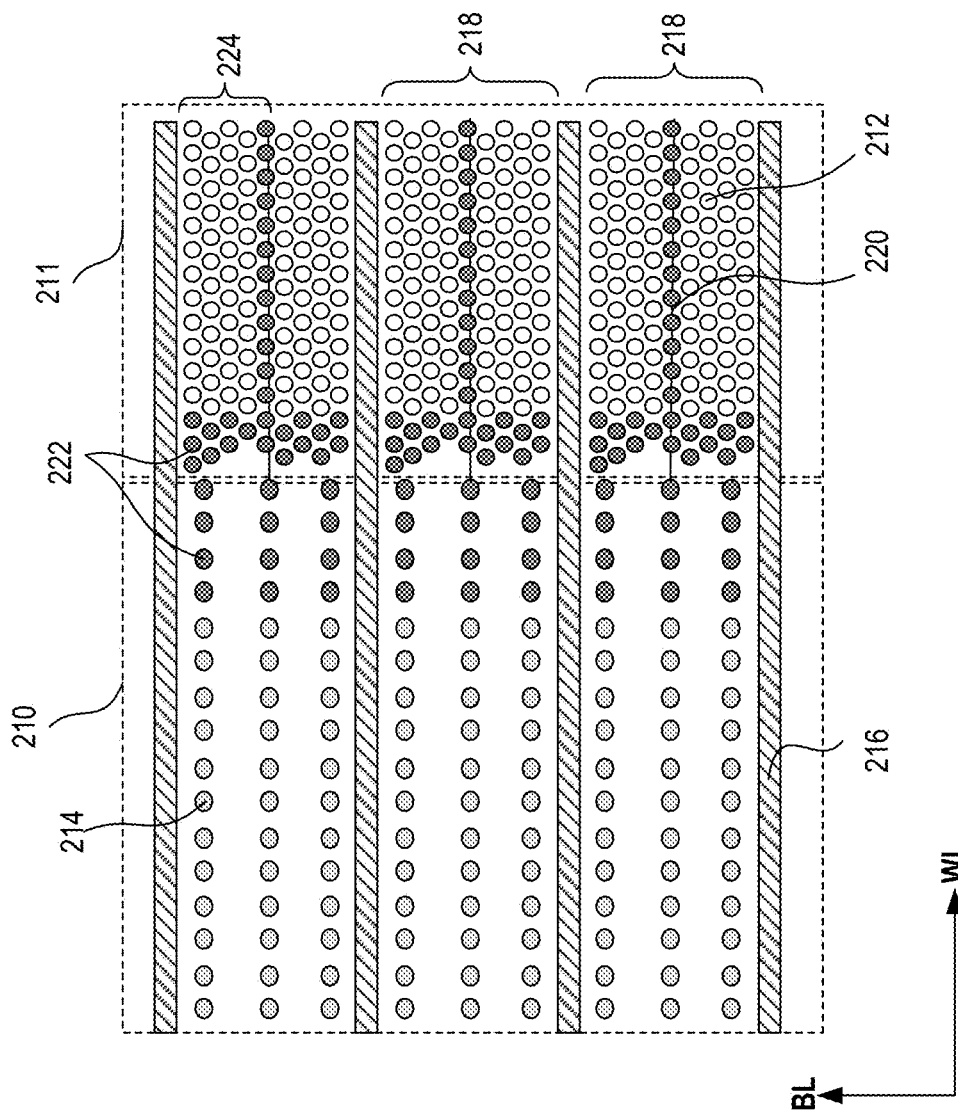
FIG. 2 illustrates a schematic top-down view of a region of 3D memory die, according to some embodiments of the present disclosure.

Referring to FIG. 2, an enlarged top-down view of a region 108 in FIG. 1 is illustrated, according to some embodiments of the present disclosure. The region 108 of the 3D memory device 100 can include a staircase region 210 and a channel structure region 211. The channel structure region 211 can include an array of memory strings 212, each including a plurality of stacked memory cells. The staircase region 210 can include a staircase structure and an array of SSCTs 214 formed on the staircase structure. In some embodiments, a plurality of GLS 216, extending in WL direction across the channel structure region 211 and the staircase region 210, can divide a memory block into multiple memory fingers 218. At least some GLS 216 can function as the common source contact (e.g., array common source) for an array of memory strings 212 in channel structure regions 211. A top select gate cut 220 can be disposed, for example, in the middle of each memory finger 218 to divide a top select gate (TSG) of the memory finger 218 into two portions, and thereby can divide a memory finger into two memory slices 224, where memory cells in a memory slice 224 that share the same word line form a programmable (read/write) memory page. While erase operation of a 3D NAND memory can be carried out at memory block level, read and write operations can be carried out at memory page level. A memory page can be kilobytes (KB) in size. In some embodiments, region 108 also includes dummy memory strings 222 for process variation control during fabrication and/or for additional mechanical support.

Figure 3:
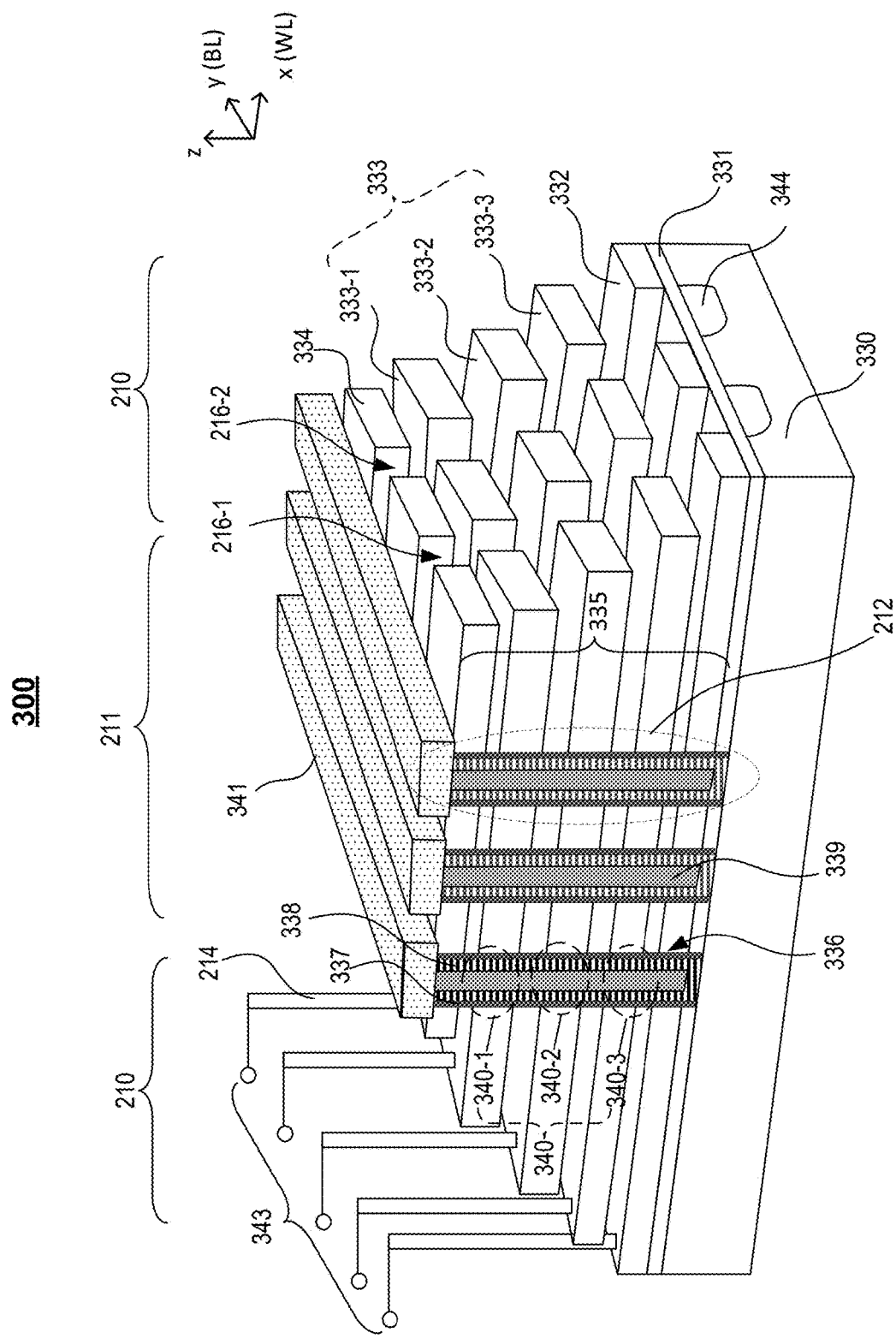
FIG. 3 illustrates a perspective view of a portion of an exemplary 3D memory array structure, in accordance with some embodiments of the present disclosure.

FIG. 3 illustrates a perspective view of a portion of an exemplary three-dimensional (3D) memory array structure 300, according to some embodiments of the present disclosure. The memory array structure 300 includes a substrate 330, an insulating film 331 over the substrate 330, a tier of lower select gates (LSGs) 332 over the insulating film 331, and a plurality of tiers of control gates 333, also referred to as "word lines (WLs)," stacking on top of the LSGs 332 to form a film stack 335 of alternating conductive and dielectric layers. The dielectric layers adjacent to the tiers of control gates are not shown in FIG. 3 for clarity.

The control gates of each tier are separated by slit structures 216-1 and 216-2 through the film stack 335. The memory array structure 300 also includes a tier of top select gates (TSGs) 334 over the stack of control gates 333. The stack of TSG 334, control gates 333 and LSG 332 is also referred to as "gate electrodes". The memory array structure 300 further includes memory strings 212 and doped source line regions 344 in portions of substrate 330 between adjacent LSGs 332. Each memory strings 212 includes a channel hole 336 extending through the insulating film 331 and the film stack 335 of alternating conductive and dielectric layers. Memory strings 212 also includes a memory film 337 on a sidewall of the channel hole 336, a channel layer 338 over the memory film 337, and a core filling film 339 surrounded by the channel layer 338. A memory cell 340 (e.g., 340-1, 340-2, 340-3) can be formed at the intersection of the control gate 333 (e.g., 333-1, 333-2, 333-3) and the memory string 212. A portion of the channel layer 338 responds to the respective control gate is also referred to as the channel layer 338 of the memory cell. The memory array structure 300 further includes a plurality of bit lines (BLs) 341 connected with the memory strings 212 over the TSGs 334. The memory array structure 300 also includes a plurality of metal interconnect lines 343 connected with the gate electrodes through a plurality of SSCTs 214. The edge of the film stack 335 is configured in a shape of staircase to allow an electrical connection to each tier of the gate electrodes.

In FIG. 3, for illustrative purposes, three tiers of control gates 333-1, 333-2, and 333-3 are shown together with one tier of TSG 334 and one tier of LSG 332. In this example, each memory string 212 can include three memory cells 340-1, 340-2 and 340-3, corresponding to the control gates 333-1, 333-2 and 333-3, respectively. In some embodiments, the number of control gates and the number of memory cells can be more than three to increase storage capacity. The memory array structure 300 can also include other structures, for example, TSG cut, common source contact (i.e., array common source) and dummy memory string. These structures are not shown in FIG. 3 for simplicity.

To increase the storage capacity of a 3D NAND flash memory, the number of control gates and the number of vertically stacked memory cells can be greatly increased, resulting in a high aspect ratio structure. Manufacturing a structure with high aspect ratio can be very challenging, for example, for forming the channel holes, slit structures, word line (staircase) contacts, bit line contacts, dummy channel holes, etc. Alignment between these structures is very critical. However, due to various processes used in the fabrication, for example, high temperature (>600° C.) film deposition and/or annealing can result in deformation of existing features on the wafer. Miss-alignment can result in defective memory cells or memory blocks (for example, bit line to word line shorts, etc). Therefore, a need exists to provide a method for forming a 3D NAND memory where overlay control between different patterns or structures can be significantly improved.

Figure 4A:
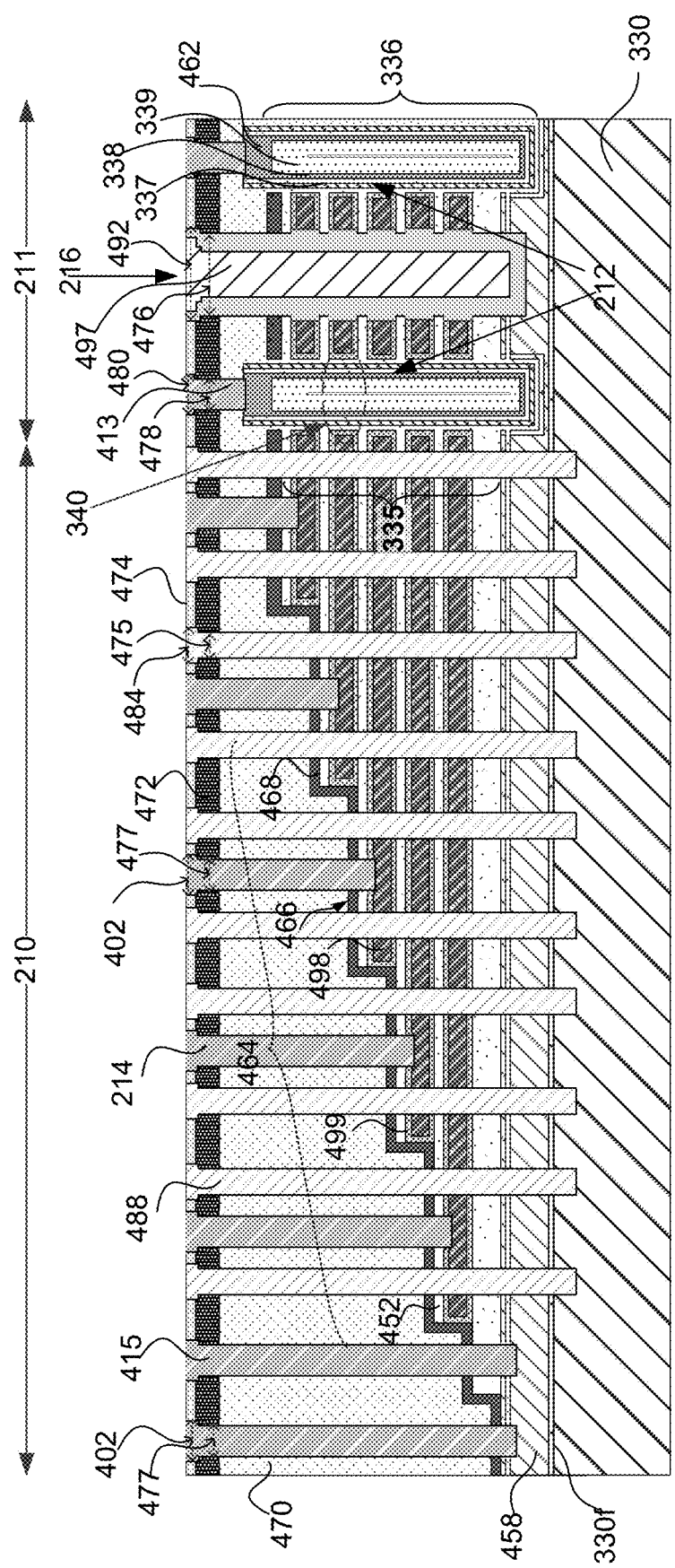
FIG. 4A illustrates a cross-sectional view of a 3D NAND flash memory device, according to some embodiments of the present disclosure.

FIG. 4A illustrates a three-dimensional (3D) memory device 400, according to some embodiments of the present disclosure. The 3D memory device 400 includes the film stack 335 of alternating conductive and dielectric layers, wherein the film stack 335 includes conductive layers 498 and first dielectric layers 452 alternatingly stacked on top of the substrate 330.

The substrate 330 can include monocrystalline, polycrystalline or single crystalline semiconductors, for example, silicon, silicon germanium (SiGe), germanium (Ge), silicon on insulator (SOI), germanium on insulator (GOI), gallium arsenide (GaAs), gallium nitride, silicon carbide, III-V compound, or any combinations thereof. In some embodiments, the substrate 330 can include a layer of semiconductor material formed on a handle wafer, for example, glass, plastic, or another semiconductor substrate.

The first dielectric layer 452 includes any suitable insulating materials, for example, silicon oxide, silicon oxynitride, silicon nitride, TEOS or silicon oxide with F-, C-, N-, and/or H- incorporation. The first dielectric layers 452 can have the same thickness or different thicknesses, which can be in a range between 10 nm to 500 nm. In some embodiments, the first dielectric layer 452 can be silicon oxide with a thickness about 25 nm.

The conductive layers 498 include any suitable metal or metal alloys such as tungsten (W), aluminum (Al), titanium (Ti), copper (Cu), cobalt (Co), nickel (Ni), titanium nitride (TiN), tungsten nitride (WN), tantalum (Ta), tantalum nitride (TaN), AlTi, or any combination thereof. The conductive layers 498 can have the same thickness or different thicknesses, which can be in a range between 10 nm to 500 nm. In some embodiments, the conductive layers 498 include W with a thickness about 35 nm.

The film stack 335 can also include a gate dielectric layer 499 surrounding the conductive layer 498. The gate dielectric layer 499 can include any suitable insulator, for example, silicon oxide, silicon nitride, silicon oxynitride, and/or any suitable combinations thereof. The gate dielectric layer 499 can also include high-k dielectric materials, such as hafnium oxide, zirconium oxide, aluminum oxide, tantalum oxide, lanthanum oxide, and/or any combination thereof.

The 3D memory device 400 also include a staircase structure 464 in the staircase region 210. The staircase structure 464 includes a plurality of staircase steps 466 formed in the film stack 335. The staircase step 466, or a "staircase layer", refers to a layer stack with the same lateral dimension in a surface parallel to a front surface 330f of the substrate 330. Each staircase step 466 terminates at a shorter length than the staircase step underneath. In some embodiments, each staircase step 466 includes one pair of the first dielectric layer 452 and the conductive layer 498. In some embodiments, each staircase step 466 can include two or more pairs of the first dielectric layer 452 and the conductive layer 498. In each staircase step, the first dielectric layer 452 can be on top of the conductive layer 498, or vice versa.

In some embodiments, the 3D memory device 400 also includes a barrier layer 468 disposed on the staircase structure 464. The barrier layer 468 can be any suitable insulating material, for example, silicon oxide, silicon nitride, silicon oxynitrde, TEOS, high-k dielectric material ($Al_2O_3$, $HfO_2$, $Ta_2O_3$, $ZrO_2$, $La_2O_3$, etc), or any combination thereof.

In some embodiments, the 3D memory device 400 also includes an insulating layer 470 disposed over the staircase structure 464 and the film stack 335. The insulating layer 470 includes silicon oxide, silicon oxynitride, silicon nitride, TEOS, spin-on-glass, low-k dielectric material, such as carbon-doped oxide (CDO or SiOC or SiOC:H), or fluorine doped oxide (SiOF), etc. In some embodiments, the insulating layer 470 has a planar surface over the staircase structure 464 and the film stack 335.

In some embodiments, the 3D memory device 400 also includes a semiconductor layer 458 sandwiched between the film stack 335 and the substrate 330. The semiconductor layer 458 can include a crystalline or poly-crystalline semiconductor material, for example, silicon, silicon germanium, germanium, gallium arsenide, gallium nitride, III-V compound, or any combination thereof.

The 3D memory device 400 also includes a plurality of channel holes 336 in the channel structure region 211, wherein the channel holes 336 vertically penetrate through the film stack 335, perpendicular to the front surface 330f of the substrate 330. In some embodiments, the channel holes 336 extend into the semiconductor layer 458. In some embodiments, the channel holes 336 extend further into the substrate 330. The channel holes 336 can be shaped as cylinders.

The channel hole 336 can include the core filling film 339 in a center, where the core filling film 339 can be surrounded by the channel layer 338. The core filling film 339 can include any suitable insulator, for example, silicon oxide, silicon nitride, silicon oxynitride, spin-on-glass, boron or phosphorus doped silicon oxide, carbon-doped oxide (CDO or SiOC or SiOC:H), fluorine doped oxide (SiOF), or any combination thereof. The channel layer 338 can include any suitable semiconductor such as polycrystalline silicon with a thickness in a range from about 10 nm to about 30 nm.

The channel holes 336 can also include the memory film 337 covering a sidewall of the channel layer 338, i.e., surrounding the channel layer 338. The memory film 337 can be a composite layer including a tunneling layer, a storage layer (also known as "charge trap/storage layer"), and a blocking layer. In some embodiments, the tunneling layer, the storage layer, and the blocking layer are arranged along a direction from a center of the channel hole 336 toward the outer of the channel hole 336 in the above order. The tunneling layer can include silicon oxide, silicon nitride, or any combination thereof. The blocking layer can include silicon oxide, silicon nitride, high dielectric constant (high-k) dielectrics, or any combination thereof. The storage layer can include silicon nitride, silicon oxynitride, silicon, or any combination thereof. In some embodiments, the memory film 337 includes ONO dielectrics (e.g., a tunneling layer including silicon oxide, a storage layer including silicon nitride, and a blocking layer including silicon oxide). In some embodiments, a thickness of the memory film 337 can be in a range from about 10 nm to about 50 nm.

The 3D memory device 400 includes a plurality of memory cells 340 vertically stacked on the substrate 330. The memory cell 340 is formed at an intersection between the conductive layer 498 and the channel hole 336. The vertically stack memory cells 340 along the same channel hole 336 can form the memory string 212. The conductive layers 498 can form word lines or control gates 333 in FIG. 3 to address the memory cells 340.

In some embodiments, the channel hole 336 also include an epitaxial plug (not shown) at bottom of the channel hole. The epitaxial plug can include any suitable semiconductor material, such as silicon, silicon germanium, germanium, gallium arsenide, gallium nitride, III-V compound, or any combination thereof. The epitaxial plug can be epitaxially grown from the semiconductor layer 458 or the substrate 330. In some embodiments, the epitaxial plug can also include a polycrystalline semiconductor material, for example, polycrystalline silicon. The epitaxial plug can be connected to the semiconductor layer 458 or the substrate 330.

The channel hole 336 can also include a top contact structure 462, configured to provide electrical contact to the channel layer 338. The top contact structure 462 can be amorphous or polycrystalline silicon, and can include metal, metal alloy and/or metal silicide, for example, tungsten, titanium, tantalum, tungsten nitride, titanium nitride, tantalum nitride, nickel silicide, cobalt silicide, tungsten silicide, titanium silicide, or a combination thereof.

In some embodiments, the film stack 335 includes an upper stack and a lower stack that can be formed sequentially, where a first channel hole can penetrate through the upper stack and a second channel hole can penetrate through the lower stack, and the first channel hole can be aligned to the second channel hole.

The 3D memory device 400 also includes a plurality of bit line contacts (BLCTs) 413. The BLCTs 413 can provide electrical connections to the top contact structures 462 and thereby provide electrical connections to the channel layers 338. Bit lines (not shown) of the 3D memory device 400 can address the memory cells 340 through the BLCTs 413. The BLCTs 413 can include metal, metal alloy and/or metal silicide, for example, tungsten, titanium, tantalum, tungsten nitride, titanium nitride, tantalum nitride, nickel silicide, cobalt silicide, tungsten silicide, titanium silicide, or a combination thereof.

The 3D memory device 400 also includes a gate line slit (GLS) 216, similar to the GLS 216 in FIGS. 2 and 3. The GLS 216 penetrates vertically through the film stack 335 and is configured to separate a memory block into multiple memory fingers. In some embodiments, the GLS 216 extends into the semiconductor layer 458. In some embodiments, the GLS 216 extends further into the substrate 330. The GLS 216 includes a GLS filler 497, which can be any suitable insulator, for example, silicon oxide, silicon nitride, silicon oxynitride, boron or phosphorus doped silicon oxide, carbon-doped oxide (CDO or SiOC or SiOC:H), or fluorine doped oxide (SiOF), or any combination thereof. It is noted that the configuration of the GLS 216 in FIG. 4 is for illustration purpose.

In some embodiments, the GLS 216 can also include a conductive core contacting the semiconductor layer 458 or the substrate 330 to function as an array common source (ACS) contact. In some embodiments, ACS contacts 415 can be formed simultaneously with staircase contacts (SSCT) 214 (similar to SSCTs 214 in FIGS. 2 and 3). The ACS contacts 415 penetrate through the insulating layer 470 and the barrier layer 468, extending into the semiconductor layer 458. In some embodiments, the ACS contacts 415 extends further into the substrate 330. The ACS contacts 415 can provide electrical connections to an array common source shared by the memory strings 212.

The SSCTs 214 penetrate through the insulating layer 470 and the barrier layer 468, contacting the conductive layers 498 of the film stack 335. From staircase steps 466 of the staircase structure 464, each conductive layer 498 can be electrically connected through one or more of the SSCTs 214. In some embodiments, the SSCTs 214 extend through the gate dielectric layer 499 to connect to the conductive layer 498.

The ACS contacts 415 and the SSCTs 214 can include any suitable conductive material. In some embodiments, the ACS contacts 415 and the SSCTs 214 can include metal, metal alloy and/or metal silicide, for example, tungsten, titanium, tantalum, tungsten nitride, titanium nitride, tantalum nitride, nickel silicide, cobalt silicide, tungsten silicide, titanium silicide, or a combination thereof.

In some embodiments, contacts for peripheral devices such as contacts to gates, sources/drains of MOSFETs can be formed simultaneously with the SSCTs 214.

In some embodiments, the 3D memory device 400 also includes a plurality of dummy channel holes (DCHs) 488 in the staircase region 210. The DCHs 488 extend vertically through the insulating layer 470 and the staircase structure 464. In some embodiments, the DCHs 488 penetrate through the semiconductor layer 458 and can further extend into the substrate 330. The DCHs 488 are configured to provide mechanical support for 3D memory device 400 during various fabrication processes. The DCHs 488 can include an insulating material, for example, silicon oxide, silicon nitride, silicon oxynitrde, TEOS, high-k dielectric material ($Al_2O_3$, $HfO_2$, $Ta_2O_3$, $ZrO_2$, $La_2O_3$, etc), or any combination thereof.

The 3D memory device 400 includes an embedded hard mask 472 disposed on the insulating layer 470 and a sacrificial hard mask 474 disposed on the embedded hard mask 472. The embedded hard mask 472 and the sacrificial hard mask 474 can include any suitable material that withstands high temperature (>600° C.), i.e., not deformed or having reaction under such high temperature. For example, the embedded hard mask 472 and the sacrificial hard mask 474 can include dielectric materials such as silicon oxide, silicon nitride, silicon oxynitride, high-k dielectric film (e.g., hafnium oxide, zirconium oxide, aluminum oxide, tantalum oxide, or lanthanum oxide, etc.), and/or any combination thereof. The sacrificial hard mask 474 includes a material different from the embedded hard mask 472 such that the sacrificial hard mask 474 can be etched selectively from the embedded hard mask 472.

The embedded hard mask 472 includes multiple sets of patterns configured to define multiple sets of vertical structures of the 3D memory device 400. The multiple sets of vertical structures are perpendicular to the front surface 330f of the substrate and are fabricated sequentially, i.e., one set of vertical structures are formed prior to fabricating another set of vertical structures. The multiple sets of vertical structures have different materials and can include, for example, the DCHs 488, the GLS 216, the SSCTs 214, the ACS contacts 415, and the BLCTs 413, which can also have different depths (i.e., vertical lengths). The multiple sets of vertical structures can be formed by different patterning processes and/or formed at different process steps (e.g., different etching processes, different thin film depositions, etc.). The multiple sets of vertical structures are not formed simultaneously. In some embodiments, processes used to form the multiple sets of vertical structures include a high temperature (>600° C.) process. In some embodiments, processes performed in between the fabrication of the multiple sets of vertical structures include a high temperature (>600° C.) process.

In some embodiments, the multiple sets of patterns in the embedded hard mask 472 includes a first set of patterns 475 configured to define the DCHs 488, a second set of patterns 476 configured to define the GLS 216, a third set of patterns 477 configured to define the SSCTs 214 and the ACS contacts 415, and a fourth set of patterns 478 configured to define the BLCTs 413. The multiple sets of patterns can also be configured to define other vertical structures of the 3D memory device 400. For example, the third set of patterns 477 can also be configured to define contacts to peripheral devices in the peripheral region 105 (in FIG. 1), for example, contacts to a gate/source/drain of a MOSFET. The embedded hard mask 472 can also include other sets of patterns to define other features of the 3D memory device 400. Critical dimensions (CD) of the multiple sets of vertical structures can be determined by the critical dimensions of the multiple sets of patterns. Here, critical dimension refers to a size of a feature measured on a plane parallel to the front surface 330f of the substrate 330.

The sacrificial hard mask 474 can fill up gaps or openings between the multiple sets of patterns of the embedded hard mask 472. The sacrificial hard mask 474 can include multiple sets of openings, corresponding to the multiple sets of patterns in the embedded hard mask 472. In some embodiments, the multiple sets of openings in the sacrificial hard mask 474 are aligned to the multiple sets of patterns in the embedded hard mask 472. For example, the sacrificial hard mask 474 can have a first set of openings 484 aligned to the first set of patterns 475, a second set of openings 492 aligned to the second set of patterns 476, a third set of openings 402 aligned to the third set of patterns 477, and a fourth set of openings 480 aligned to the fourth set of patterns 478.

In some embodiments, critical dimensions of the multiple sets of openings in the sacrificial hard mask 474 can be larger than critical dimensions of corresponding multiple sets of patterns in the embedded hard mask 472. For example, as shown in FIG. 4A, critical dimension of the first set of openings 484 is larger than that of the first set of patterns 475; critical dimension of the second set of openings 492 is larger than that of the second set of patterns 476; critical dimension of the third set of openings 402 is larger than that of the third set of patterns 477; and critical dimension of the fourth set of openings 480 is larger than that of the fourth set of patterns 478. In some embodiments, the multiple sets of vertical structures (e.g., the DCHs 488, the GLS 216, the SSCTs 214, the ACS contacts 415, and the BLCTs 413) extend through the multiple sets of openings in the sacrificial hard mask 474 and the multiple sets of patterns in the embedded hard mask 472, and can thereby form "T" shaped cross-sections, where heads of the "T" shapes are located in the sacrificial hard mask 474. In some embodiments, the heads of the "T" shapes can extend into an upper portion of the embedded hard mask 472. In some embodiments, the multiple sets of vertical structures and the sacrificial hard mask 474 can have a coplanar surface.

In one example, a first hard mask can be used to pattern a first set of vertical structures and can be removed after a first patterning process. Subsequently, in a second patterning process, a second hard mask can be used to pattern a second set of vertical structures, where the second set of vertical structures can be aligned to the first set of vertical structures. Widths (or critical dimensions) of the second set of vertical structures can be determined by the second hard mask and widths (or critical dimensions) of the first set of vertical structures can be determined by the first hard mask. Here, in the present disclosure, two or more sets of patterns can be formed in the embedded hard mask 472 simultaneously. The two or more sets of patterns can include, for example, a first set of patterns for patterning a first set of vertical structures at a first patterning process and a second set of patterns for patterning a second set of vertical structures at a second patterning process that is different from the first patterning process. During the second patterning process, the second set of vertical structures can be aligned to the first set of vertical structures. The first and second sets of patterns determine the widths (critical dimensions) of the respective first and second sets of vertical structures. In the present disclosure, the embedded hard mask 472 is embedded (i.e., enclosed) in the 3D memory device 400 such that the embedded hard mask 472 can be protected through various subsequent fabrication processes. In one example, the embedded hard mask 472 is covered by the sacrificial hard mask 474. Particularly, the two or more sets of patterns formed in the embedded hard mask 472 are embedded in the 3D memory device 400. In one example, the two or more sets of patterns can be filled and covered by the sacrificial hard mask 474.

Figure 4C:
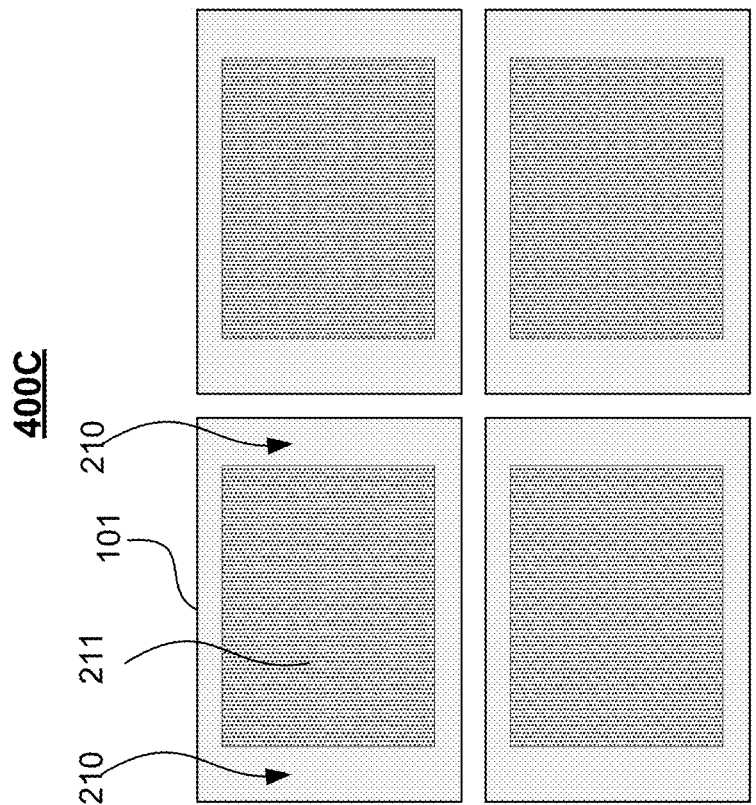
FIGS. 4B and 4C illustrate two exemplary layouts of the 3D flash memory device in FIG. 4A, according to some embodiments of the present disclosure.
Figure 4B:
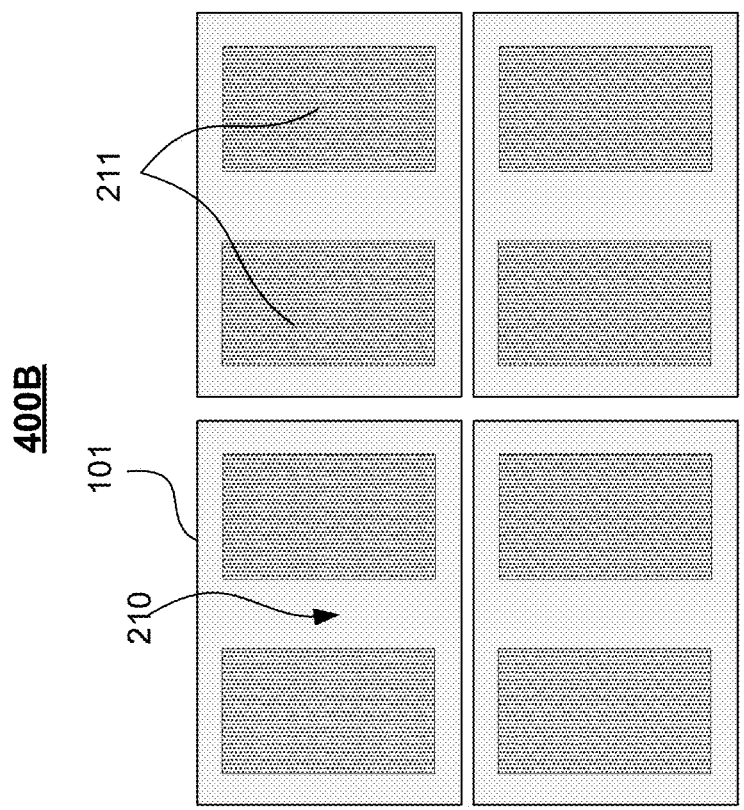

FIGS. 4B and 4C illustrate top-down views of the 3D memory device 400 shown in FIG. 4A, according to some embodiments of the present disclosure. In FIG. 4B, the memory plane 101 includes two channel structure regions 211, where the staircase region 210 is located in between the channel structure regions 211. In FIG. 4C, the memory plane 101 includes one channel structure regions 211, where the staircase regions 210 are located on two opposite sides of the channel structure regions 211.

Figure 5:
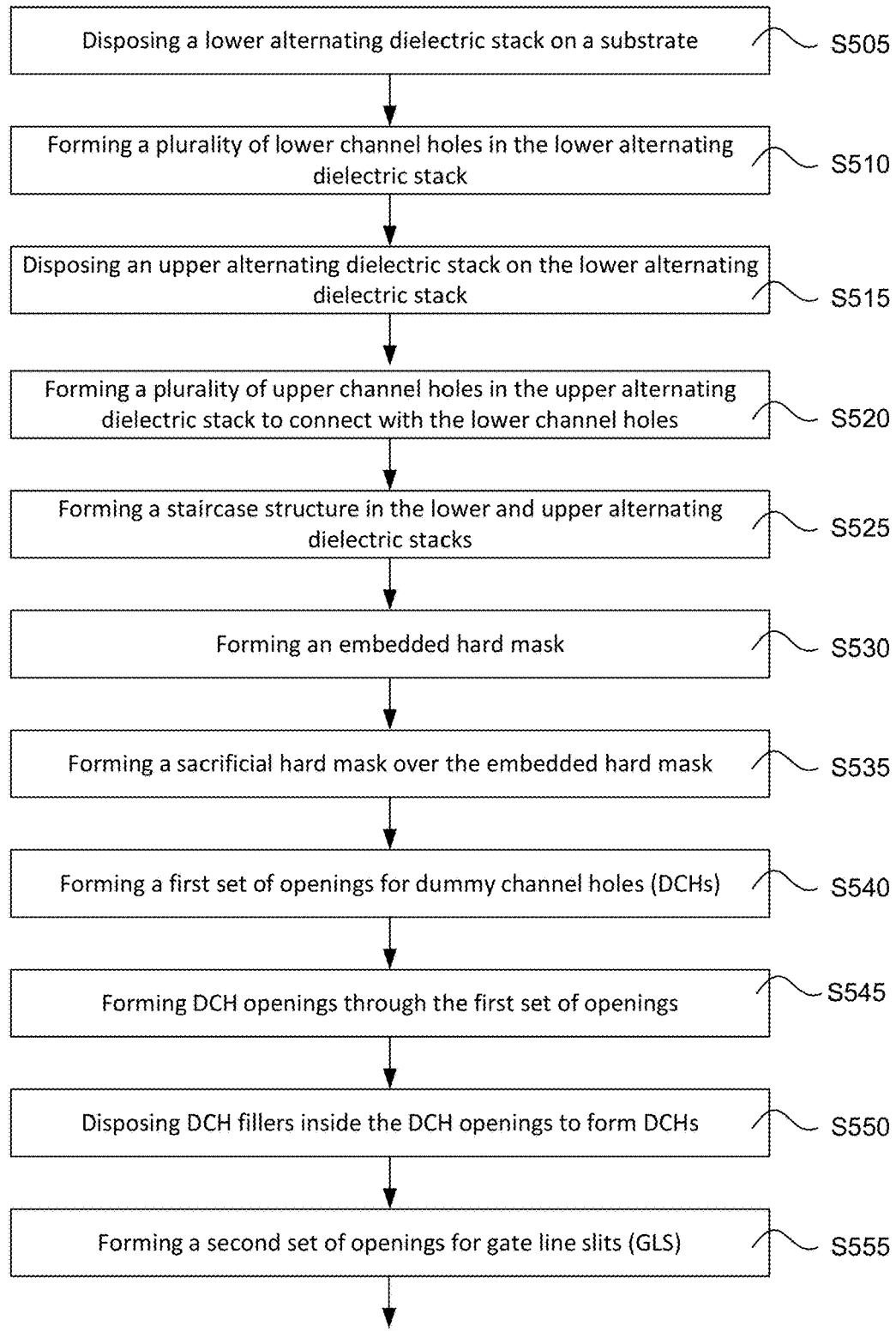
FIG. 5 illustrates a method for forming the 3D memory device in FIGS. 4A-4C, according to some embodiments of the present disclosure.
Figure 5:
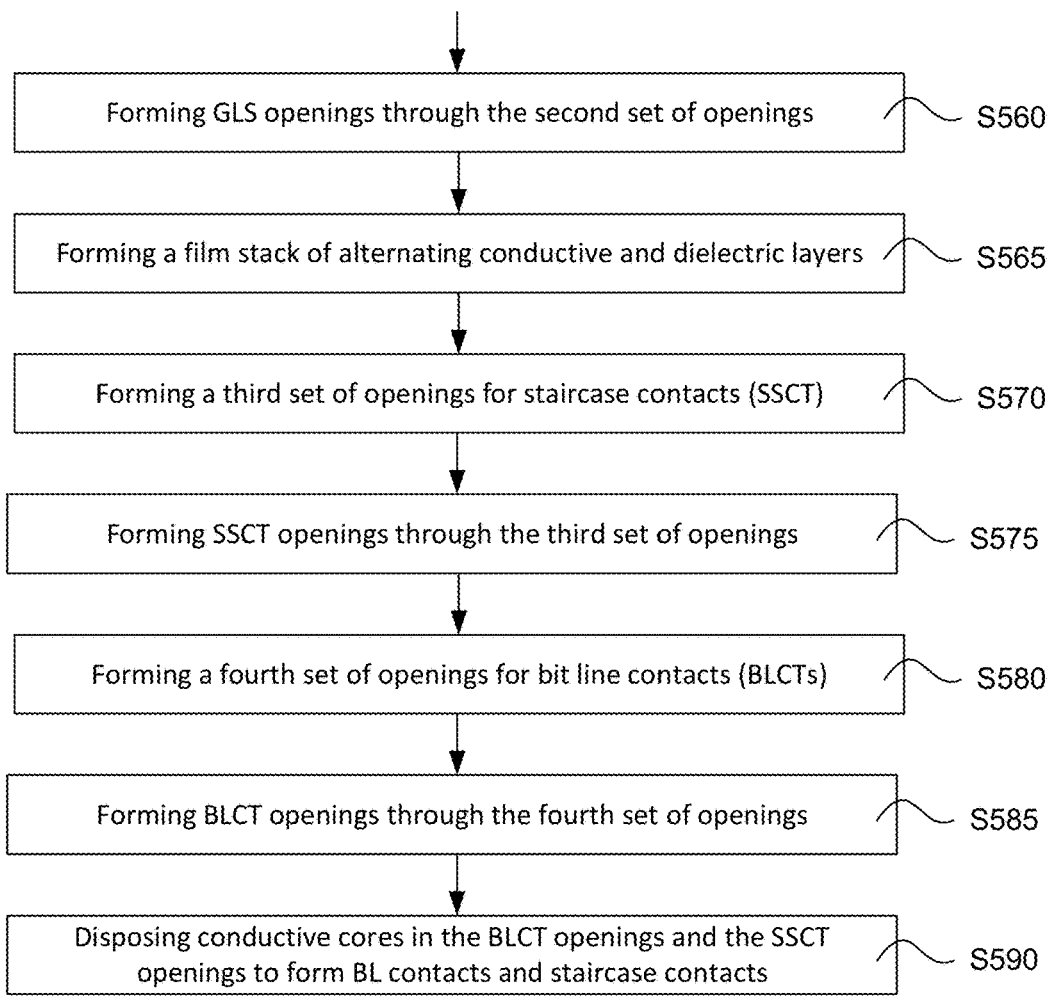

FIG. 5 illustrates a method 500 for forming the three-dimensional (3D) memory device 400 in FIG. 4A, according to some embodiments of the present disclosure. It should be understood that process steps shown in method 500 are not exhaustive and that other steps can be performed as well before, after, or between any of the illustrated steps. In some embodiments, some steps of method 500 can be omitted or include other steps that are not described here for simplicity. In some embodiments, steps of method 500 can be performed in a different order and/or vary.

FIGS. 6, 7A-7B, 8A-8B, 9A-9C, 10A-10B, 11-12, 13A-13C, 14, 15A-15B, 16-19 illustrate exemplary structures of the 3D memory device 400 at certain process step according to the method 500.

Referring to FIG. 5, at process step S505, a lower alternating dielectric stack can be disposed on a substrate. A cross-sectional view of an exemplary 3D memory structure 600 is shown in FIG. 6, according to the process step S505.

Figure 6:
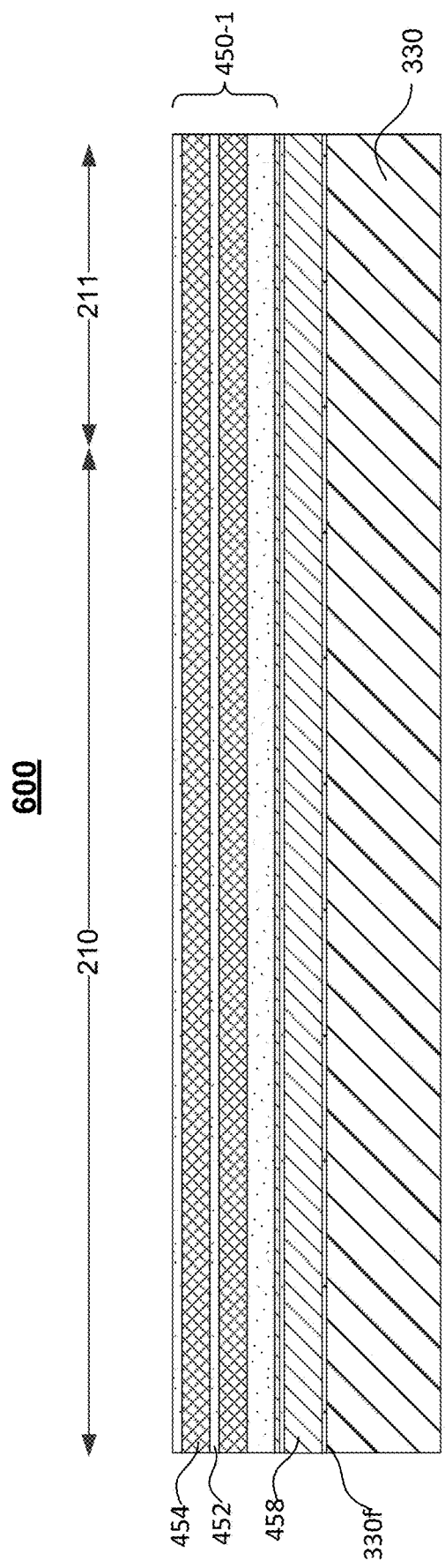
FIG. 6 illustrates a cross-sectional view of the 3D memory device in FIG. 4A at certain process step, according to some embodiments of the present disclosure.

As shown in FIG. 6, the 3D memory structure 600 include a lower alternating dielectric stack 450-1 disposed on the substrate 330. The 3D memory structure 600 include the staircase region 210 and the channel structure region 211.

The substrate 330 can provide a platform for forming subsequent structures. In some embodiments, the substrate 330 can be any suitable semiconductor substrate having any suitable semiconductor materials, such as monocrystalline, polycrystalline or single crystalline semiconductors. For example, the substrate 330 can include silicon, silicon germanium (SiGe), germanium (Ge), silicon on insulator (SOI), germanium on insulator (GOI), gallium arsenide (GaAs), gallium nitride, silicon carbide, III-V compound, or any combinations thereof. In some embodiments, the substrate 330 can include a layer of semiconductor material formed on a handle wafer, for example, glass, plastic, or another semiconductor substrate.

A front surface 330f of the substrate 330 is also referred to as a "main surface" or a "top surface" of the substrate herein. Layers of materials can be disposed on the front surface 330f of the substrate 330. A "topmost" or "upper" layer is a layer farthest or farther away from the front surface 330f of the substrate. A "bottommost" or "lower" layer is a layer closest or closer to the front surface 330f of the substrate.

In some embodiments, the lower alternating dielectric stack 450-1 includes a plurality of dielectric layer pairs alternatingly stacked on top of each other, where each dielectric layer pair includes a first dielectric layer 452 (also referred to as "dielectric layer") and a second dielectric layer 454 (also referred to as "sacrificial layer") that is different from the first dielectric layer 452. The lower alternating dielectric stack 450-1 extends in a lateral direction that is parallel to the front surface 330f of the substrate 330.

In the lower alternating dielectric stack 450-1, first dielectric layers 452 and second dielectric layers 454 alternate in a vertical direction, perpendicular to the substrate 330. In the other words, each second dielectric layer 454 can be sandwiched between two first dielectric layers 452, and each first dielectric layer 452 can be sandwiched between two second dielectric layers 454 (except the bottommost and the topmost layer).

The formation of the lower alternating dielectric stack 450-1 can include disposing the first dielectric layers 452 to each have the same thickness or to have different thicknesses. Example thicknesses of the first dielectric layers 452 can range from 10 nm to 500 nm, preferably about 25 nm. Similarly, the second dielectric layer 454 can each have the same thickness or have different thicknesses. Example thicknesses of the second dielectric layer 454 can range from 10 nm to 500 nm, preferably about 35 nm. It should be understood that the number of dielectric layer pairs in FIG.

6 is for illustrative purposes only and that any suitable number of layers may be included in the lower alternating dielectric stack 450-1.

In some embodiments, the first dielectric layer 452 includes any suitable insulating materials, for example, silicon oxide, silicon oxynitride, silicon nitride, TEOS or silicon oxide with F-, C-, N-, and/or H- incorporation. The first dielectric layer 452 can also include high-k dielectric materials, for example, hafnium oxide, zirconium oxide, aluminum oxide, tantalum oxide, or lanthanum oxide films. In some embodiments, the first dielectric layer 452 can be any combination of the above materials.

The formation of the first dielectric layer 452 on the substrate 330 can include any suitable deposition methods such as, chemical vapor deposition (CVD), physical vapor deposition (PVD), plasma-enhanced CVD (PECVD), rapid thermal chemical vapor deposition (RTCVD), low pressure chemical vapor deposition (LPCVD), sputtering, metal-organic chemical vapor deposition (MOCVD), atomic layer deposition (ALD), high-density-plasma CVD (HDP-CVD), thermal oxidation, nitridation, any other suitable deposition method, and/or combinations thereof.

In some embodiments, the second dielectric layer 454 includes any suitable material that is different from the first dielectric layer 452 and can be removed selectively with respect to the first dielectric layer 452. For example, the second dielectric layer 454 can include silicon oxide, silicon oxynitride, silicon nitride, TEOS, poly-crystalline silicon, poly-crystalline germanium, poly-crystalline germanium-silicon, and any combinations thereof. In some embodiments, the second dielectric layer 454 also includes amorphous semiconductor materials, such as amorphous silicon or amorphous germanium. The second dielectric layer 454 can be disposed using a similar technique as the first dielectric layer 452, such as CVD, PVD, ALD, thermal oxidation or nitridation, or any combination thereof.

In some embodiments, the first dielectric layer 452 can be silicon oxide and the second dielectric layer 454 can be silicon nitride.

In some embodiments, the lower alternating dielectric stack 450-1 can include layers in addition to the first dielectric layer 452 and the second dielectric layer 454, and can be made of different materials and/or with different thicknesses.

In addition to the lower alternating dielectric stack 450-1, in some embodiments, peripheral devices (not shown) can be formed in the peripheral region 105 (see FIG. 1) on the front surface 330f of the substrate 330. In some embodiments, active device areas (not shown) can also be formed in the memory blocks 103 (see FIG. 1) on the front surface 330f of the substrate 330. The peripheral devices can include any suitable semiconductor devices, for example, metal oxide semiconductor field effect transistors (MOSFETs), diodes, resistors, capacitors, etc. The peripheral devices can be used in the design of digital, analog and/or mixed signal circuits supporting the storage function of the memory core, for example, row and column decoders, drivers, page buffers, sense amplifiers, timing and controls. The active device areas in the memory blocks are surrounded by isolation structures, such as shallow trench isolation. Doped regions, such as p-type doped and/or n-type doped wells, can be formed in the active device area according to the functionality of the array devices in the memory blocks.

In some embodiments, the 3D memory structure 600 can also include a semiconductor layer 458. The semiconductor layer 458 can include a crystalline or poly-crystalline semiconductor material, for example, silicon, silicon germanium, germanium, gallium arsenide, gallium nitride, III-V compound, or any combination thereof. The semiconductor layer 458 can be epitaxially grown from the substrate 330. In some embodiments, the semiconductor layer 458 can be selectively grown from an exposed surface of the substrate 330. In some embodiments, the semiconductor layer 458 can be epitaxially grown from a doped region (not shown in FIG. 5) in the substrate 330. The doped region can be formed by ion implantation using p-type or n-type dopants, for example boron, phosphorus, arsenic, or any combination thereof. The ion implantation can be performed before the deposition of the lower alternating dielectric stack 450-1. In some embodiments, the semiconductor layer 458 can be formed by other techniques, for example, ALD, CVD, PVD, or wafer bonding (e.g., to form silicon-on-insulator substrate).

Referring to FIG. 5, at process step S510, a plurality of lower channel holes can be formed in the lower alternating dielectric stack. A cross-sectional view and a top-down view of an exemplary 3D memory structure 700 are shown in FIGS. 7A and 7B, respectively, according to the process step S510.

Figure 7A:
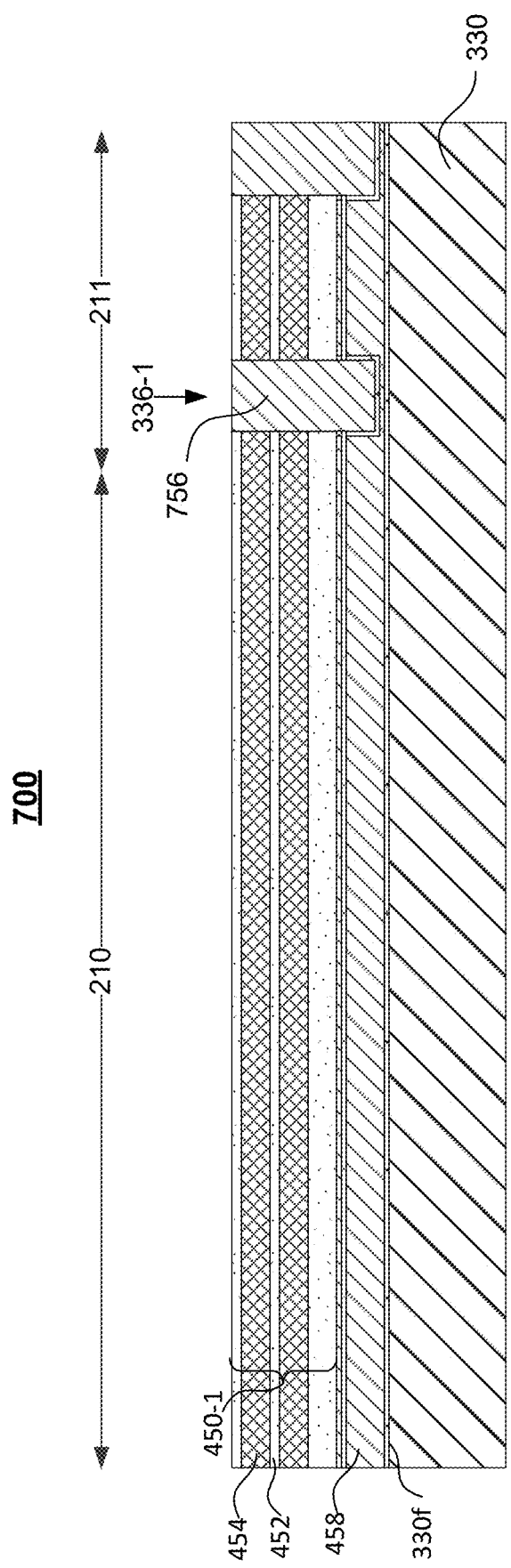
FIGS. 7A and 7B illustrate a cross-sectional view and a top-down view of the 3D memory device in FIG. 4A at certain process step, respectively, according to some embodiments of the present disclosure.

As shown in FIG. 7A, the 3D memory structure 700 include a plurality of lower channel holes 336-1 formed in the lower alternating dielectric stack 450-1 in the channel structure region 211, wherein the plurality of lower channel holes 336-1 penetrate through the lower alternating dielectric stack 450-1 and extend into the semiconductor layer 458. In some embodiments, the lower channel holes 336-1 can further extend into the substrate 330. In some embodiments, an insulating filler 756 can be disposed inside the lower channel hole 336-1.

Figure 7B:
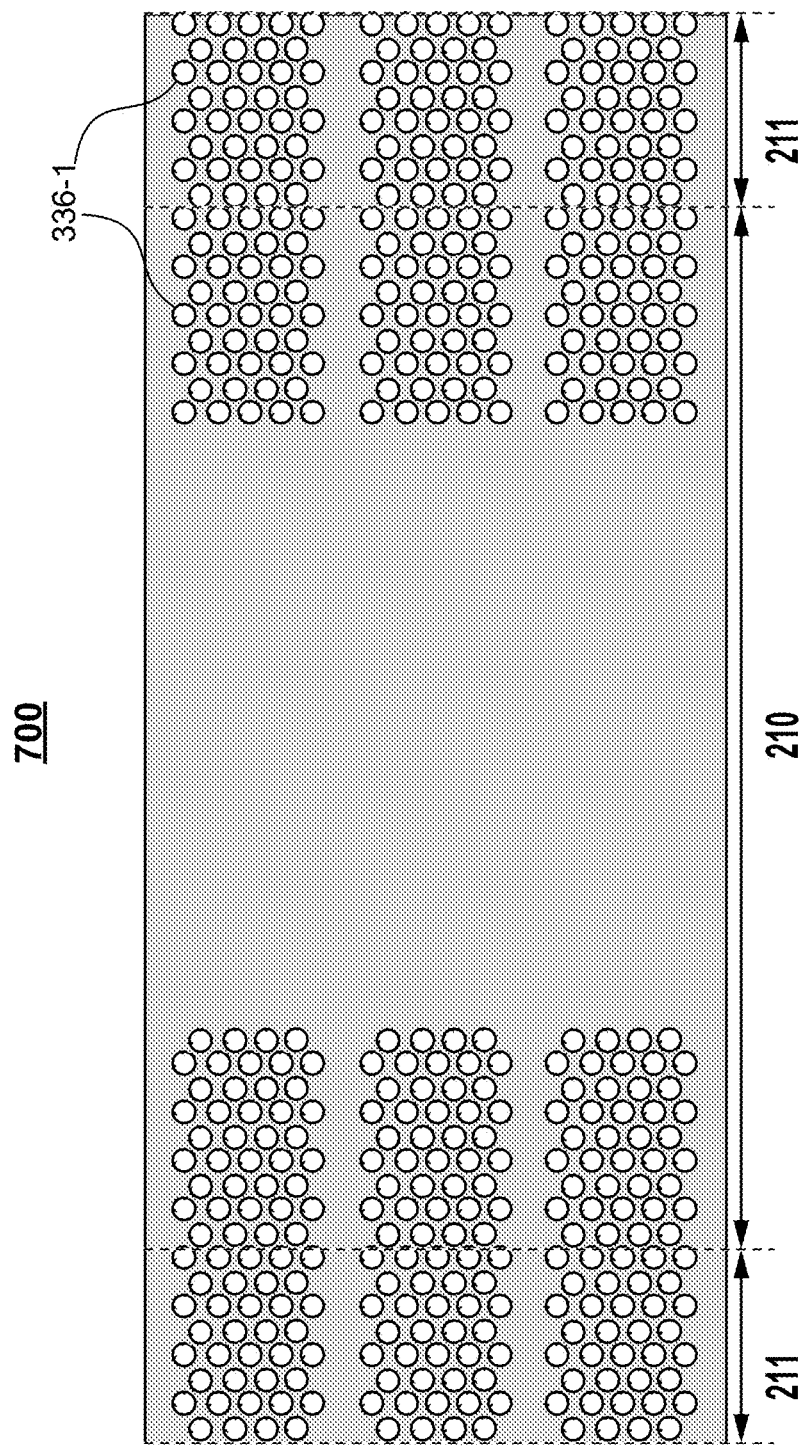

As shown in FIG. 7B, the lower channel holes 336-1 can be formed in the channel structure region 211. In some embodiments, the lower channel holes 336-1 can also be formed in a portion of the staircase region 210 that is adjacent to the channel structure region 211 to improve process window (e.g., to provide uniformity in forming the lower channel holes 336-1). In some embodiments, the lower channel holes 336-1 can have a cylinder shape.

In some embodiments, forming of the lower channel holes 336-1 includes processes such as photolithography and etching. In some embodiments, a carbon-based polymer material or a hard mask can be used in addition to photo-resist for the etching process. The hard mask can include silicon oxide, silicon nitride, TEOS, silicon-containing anti-reflective coating (SiARC), amorphous silicon, or polycrystalline silicon, or any combination thereof. The etching process to form the lower channel holes 336-1 can include a dry etching, a wet etching, or a combination thereof. In some embodiments, the lower alternating dielectric stack 450-1 can be etched using an anisotropic etching such as a reactive ion etch (ME). In some embodiments, fluorine or chlorine based gases such as carbon-fluorine ($CF_4$), hexafluoroethane ($C_2F_6$), $CHF_3$, $C_3F_6$, $Cl_2$, $BCl_3$, etc., or any combination thereof, can be used. The methods and etchants to etch the first dielectric layer 452 and the second dielectric layers 454 should not be limited by the embodiments of the present disclosure.

Referring to FIG. 5, at process step S515, an upper alternating dielectric stack can be disposed on the lower alternating dielectric stack, i.e., over the 3D memory structure 700 in FIG. 7A. At process step S520, a plurality of upper channel holes can be formed in the upper alternating dielectric stack to connect with the lower channel holes. At process step S525, a staircase structure can be formed in the lower alternating dielectric stack and the upper alternating dielectric stack. A cross-sectional view and a top-down view of an exemplary 3D memory structure 800 are shown in FIGS. 8A and 8B, respectively, according to the process steps S515, S520 and S525.

Figure 8A:
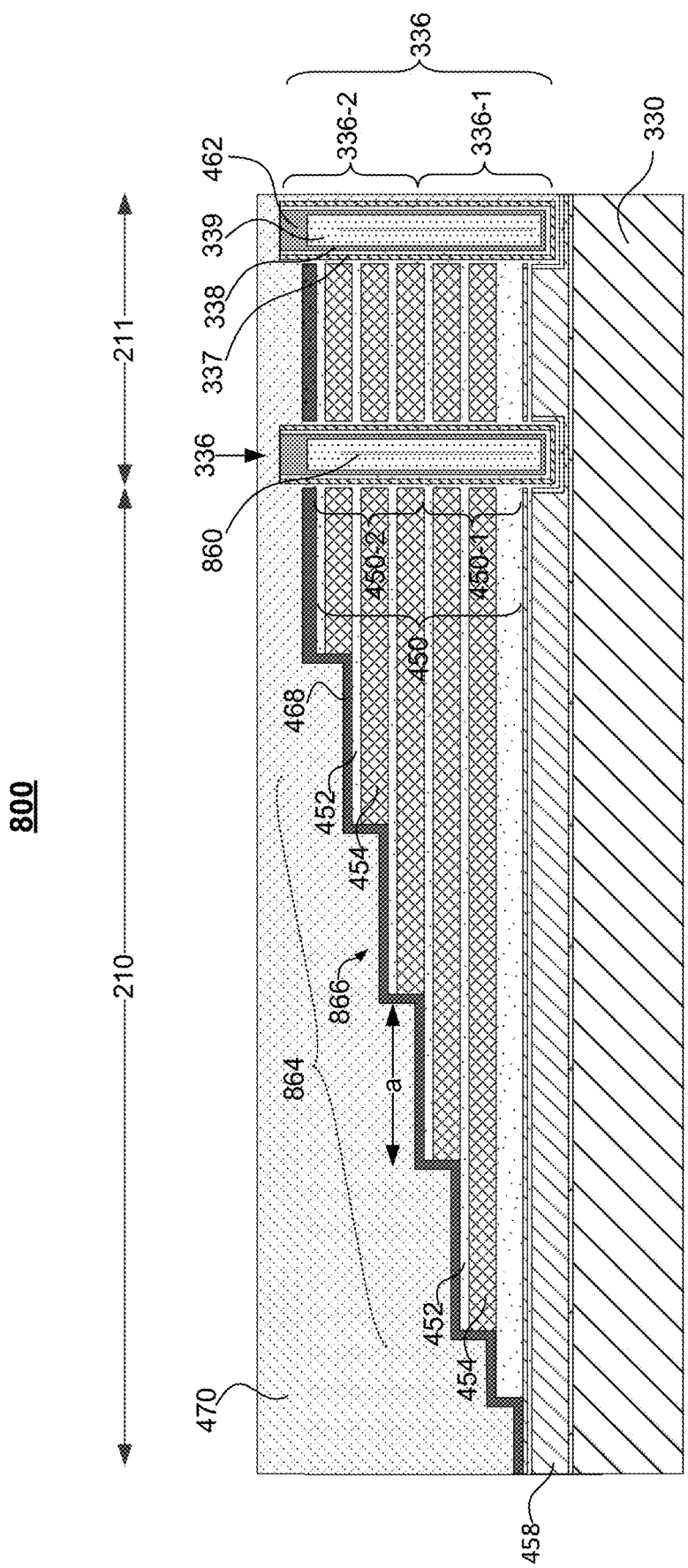

As shown in FIG. 8A, the 3D memory structure 800 include an upper alternating dielectric stack 450-2 disposed on the lower alternating dielectric stack 450-1. In some embodiments, the upper alternating dielectric stack 450-2 can be similar to the lower alternating dielectric stack 450-1 and can also include a plurality of dielectric layer pairs alternatingly stacked on top of each other. In some embodiment, each dielectric layer pair of the upper alternating dielectric stack can also include the first dielectric layer 452 and the second dielectric layer 454. In this example, the lower alternating dielectric stack 450-1 and the upper alternating dielectric stack 450-2 together can be referred to as the alternating dielectric stack 450. In some embodiments, the alternating dielectric stack 450 can also include layers other than the first dielectric layer 452 and the second dielectric layer 454. For example, the alternating dielectric stack 450 can also include an interface layer (not shown) located between the lower alternating dielectric stack 450-1 and the upper alternating dielectric stack 450-2. The interface layer can include an insulating material similar to the first dielectric layer 452 and the second dielectric layer 454. The interface layer can include an insulating material different from the first dielectric layer 452 and the second dielectric layer 454.

After disposing the upper alternating dielectric stack 450-2, a plurality of upper channel holes 336-2 can be formed, where the upper channel hole 336-2 can be substantially aligned with the lower channel hole 336-1 to form a channel hole 336 that penetrates vertically through the entire alternating dielectric stack 450. Similar techniques can be used to form the upper channel holes 336-2 and the lower channel holes 336-1, e.g., including processes such as photolithography and etching. The etching process to form the upper channel holes 336-2 can also include a dry etching, a wet etching, or a combination thereof. In some embodiments, the upper alternating dielectric stack 450-2 can be etched using an anisotropic etching such as a reactive ion etch (ME). In some embodiments, fluorine or chlorine based gases such as carbon-fluorine ($CF_4$), hexafluoroethane ($C_2F_6$), $CHF_3$, $C_3F_6$, $Cl_2$, $BCl_3$, etc., or any combination thereof, can be used. The methods and etchants to etch the first dielectric layer 452 and the second dielectric layers 454 should not be limited by the embodiments of the present disclosure.

The photolithography process used to pattern the upper channel holes can have an overlay tolerance such that the upper channel holes 336-2 are substantially aligned with the lower channel holes 336-1 to form the channel holes 336 penetrating both the upper alternating dielectric stack 450-2 and the lower alternating dielectric stack 450-1. As such, the upper channel holes 336-2 and the lower channel holes 336-1 can be connected, where each channel hole 336 includes the lower channel hole 336-1 at bottom and the upper channel hole 336-2 on the top.

In some embodiments, the upper channel holes 336-2 and the lower channel holes 336-1 can have similar shapes (e.g., cylindrical) and similar dimensions. As shown in FIG. 8B, from top-down, the upper channel holes 336-2 can be aligned with the lower channel holes 336-1.

In some embodiments, the insulating filler 756 inside the lower channel holes 336-1 in FIG. 7A can be removed after forming the upper channel holes. The insulating filler 756 functions as a sacrificial material used to protect the lower channel holes 336-1 during the formation of the upper channel holes 336-2. In some embodiments, a gouging (not shown in FIG. 8A) in the interface layer between the lower alternating layer stack 450-1 and the upper alternating layer stack 450-2 can be formed due to the removal process of the insulating filler or an extended etching process for the upper channel holes 336-2 in the upper alternating layer stack 450-2.

After forming the channel holes 336, the memory film 337 can be disposed a sidewall of the channel holes 336. In some embodiments, the memory film 337 can be a composite layer including a tunneling layer, a storage layer (also known as "charge trap/storage layer"), and a blocking layer. In some embodiments, the tunneling layer, the storage layer, and the blocking layer are arranged along a direction from a center of the channel hole 336 toward the outer of the channel hole 336 in the above order. The tunneling layer can include silicon oxide, silicon nitride, or any combination thereof. The blocking layer can include silicon oxide, silicon nitride, high dielectric constant (high-k) dielectrics, or any combination thereof. The storage layer can include silicon nitride, silicon oxynitride, silicon, or any combination thereof. In some embodiments, the memory film 337 includes ONO dielectrics (e.g., a tunneling layer including silicon oxide, a storage layer including silicon nitride, and a blocking layer including silicon oxide). The memory film 337 can be formed by using a thin film deposition process, such as ALD, CVD, PVD, sputtering or any other suitable process. In some embodiments, a thickness of the memory film 337 can be in a range from about 10 nm to about 50 nm.

Next, the channel layer 338 and the core filling film 339 can be disposed in the channel holes 336, where the channel layer 338 covers a sidewall of the memory film 337 inside the channel hole 336. The channel layer 338 can be any suitable semiconductor material such as silicon. In some embodiments, the channel layer 338 can be amorphous, polysilicon, or single crystalline silicon. The channel layer 338 can be formed by any suitable thin film deposition processes including, but not limited to, CVD, PVD, ALD, sputtering, evaporation, or a combination thereof. In some embodiments, a thickness of the channel layer 338 can be in a range from about 10 nm to about 30 nm.

In some embodiments, the core filling film 339 can be disposed to fill the channel holes 336. In some embodiments, the middle of the core filling film 339 can include one or more seams 860. The core filling film 339 can be any suitable insulator, for example, silicon oxide, silicon nitride, silicon oxynitride, spin-on-glass, boron or phosphorus doped silicon oxide, carbon-doped oxide (CDO or SiOC or SiOC:H), fluorine doped oxide (SiOF), or any combination thereof. The core filling film 339 can be deposited by using, for example, ALD, PVD, CVD, spin-coating, sputtering, or any other suitable film deposition techniques. The core filling film 339 can also be formed by using repeated deposition and etch-back processes. The etch-back process can include, but not limited to, a wet etching, a dry etching, or a combination thereof.

In some embodiments, the 3D memory structure 800 also includes a top contact structure 462 at a top portion of the upper channel hole 336-2. The top contact structure 462 can form electrical contact with the channel layer 338 inside the channel hole 336. The top contact structure 462 can be amorphous or polycrystalline silicon, and can include metal, metal alloy and/or metal silicide, for example, tungsten, titanium, tantalum, tungsten nitride, titanium nitride, tantalum nitride, nickel silicide, cobalt silicide, tungsten silicide, titanium silicide, or a combination thereof. The top contact structure 462 can be formed by a recess etching process followed by thin film deposition. The recess etching process includes wet etch, dry etch or a combination thereof. The thin film deposition includes CVD, PVD, ALD, sputtering, or any other suitable processes.

In some embodiments, the 3D memory structure 800 can include an epitaxial plug (not shown) at bottom of the lower channel hole 336-1. The epitaxial plug can include any suitable semiconductor material, such as silicon, silicon germanium, germanium, gallium arsenide, gallium nitride, III-V compound, or any combination thereof. The epitaxial plug can be epitaxially grown from the semiconductor layer 458 or the substrate 330. In some embodiments, the epitaxial plug can also include a polycrystalline semiconductor material, for example, polycrystalline silicon. In some embodiments, a portion of the memory film 337 at the bottom of the lower channel hole 336-1 can be removed such that the channel layer 338 can directly contact with the epitaxial plug.

After forming the channel holes 336, a staircase structure 864 with a plurality of staircase steps 866 can be formed in the alternating dielectric stack 450. The staircase step 866, or a "staircase layer", refers to a layer stack with the same lateral dimension in a surface parallel to the front surface 330$f$. Each staircase step 866 terminates at a shorter length than the staircase step underneath, with a lateral dimension "a" shown in FIG. 8A. In some embodiments, each staircase step 866 includes one pair of the first dielectric layer 452 and the second dielectric layer 454. In some embodiments, each staircase step 866 can include two or more pairs of the first dielectric layer 452 and the second dielectric layer 454.

The staircase structure 864 can be formed by applying a repetitive etch-trim process on the alternating dielectric stack 450. The etch-trim process includes an etching process and a trimming process. During the etching process, a portion of each staircase step 866 with exposed surface can be removed. The remaining portion of each staircase step 866, either covered by upper levels of staircase steps or covered by a patterning mask, is not etched. The etch depth is a thickness of the staircase step 866. In some embodiments, the thickness of the staircase step 866 is a thickness of one pair of the first dielectric layer 452 and the second dielectric layer 454. The etching process for the first dielectric layer 452 can have a high selectivity over the second dielectric layer 454, and/or vice versa. Accordingly, an underlying dielectric layer pair can function as an etch-stop layer. By switching etching process for each layer, the staircase step 866 can be etched during one etching cycle. And as a result, one staircase step 866 is formed during each etch-trim cycle.

In some embodiments, the staircase step 866 can be etched using an anisotropic etching such as a reactive ion etch (RIE) or other dry etch processes. In some embodiments, the first dielectric layer 452 is silicon oxide. In this example, the etching of silicon oxide can include RIE using fluorine based gases, for example, carbon-fluorine ($CF_4$), hexafluoroethane ($C_2F_6$), $CHF_3$, or $C_3F_6$ and/or any other suitable gases. In some embodiments, the silicon oxide layer can be removed by wet chemistry, such as hydrofluoric acid or a mixture of hydrofluoric acid and ethylene glycol. In some embodiments, a timed etching approach can be used. In some embodiments, the second dielectric layer 454 is silicon nitride. In this example, the etching of silicon nitride can include RIE using $O_2$, $N_2$, $CF_4$, $NF_3$, $Cl_2$, HBr, $BCl_3$, and/or combinations thereof. The methods and etchants to remove a single layer stack should not be limited by the embodiments of the present disclosure.

The trimming process includes applying a suitable etching process (e.g., an isotropic dry etch or a wet etch) on the patterning mask such that the patterning mask can be pulled back laterally. The lateral pull-back dimension determines the lateral dimension "a" of each step of the staircase structure 864. After patterning mask trimming, one portion of the topmost staircase step 866 is exposed and the other portion of the topmost staircase step 866 remains covered by the patterning mask. The next cycle of etch-trim process resumes with the etching process. In some embodiments, the patterning mask trimming process can include dry etching, such as ME using $O_2$, Ar, $N_2$, etc.

As discussed above, according to the process steps of method 500 in FIG. 5, the upper channel holes 336-2 are formed at process step S520, prior to forming the staircase structure 864. In some embodiments, the staircase structure 864 can be formed prior to forming the upper channel holes 336-2.

In some embodiments, the 3D memory structure 800 also includes the barrier layer 468, which can be disposed after forming the staircase structure 864. The barrier layer 468 covers the staircase structure 864 on both lateral surfaces and vertical sidewalls. In some embodiments, the barrier layer 468 can be an optional etch-stop layer. For example, the barrier layer 468 can be used as an etch-stop layer for protecting the underlying structure during contact hole etching processes. In some embodiments, the barrier layer 468 can be any suitable insulating material, for example, silicon oxide, silicon nitride, silicon oxynitrde, TEOS, high-k dielectric material ($Al_2O_3$, $HfO_2$, $Ta_2O_3$, $ZrO_2$, $La_2O_3$, etc), or any combination thereof. The barrier layer 468 can be disposed by any suitable thin film deposition techniques such as CVD, ALD, PVD, sputtering, evaporation, etc.

In some embodiments, the 3D memory structure 800 further includes the insulating layer 470, which can be disposed over the staircase structure 864. The insulating layer 470 can be any a suitable insulator, for example, silicon oxide, silicon oxynitride, silicon nitride, TEOS, etc. The insulating layer 470 can be formed by CVD, PVD, ALD and/or any combination thereof. In some embodiments, the insulating layer 470 can also include spin-on-glass, a mixture of silicon oxide and dopants (either boron or phosphorous) that is suspended in a solvent solution, and can be disposed using processes, for example, spin-coating. In some embodiments, the insulating layer 470 can include a low-k dielectric material, such as carbon-doped oxide (CDO or SiOC or SiOC:H), or fluorine doped oxide (SiOF), etc. The low-k dielectric material can be disposed by CVD, PVD, sputtering, etc.

In some embodiments, a planarization process, for example RIE etch-back and/or chemical mechanical polishing (CMP) can be used to form a planar surface for the insulating layer 470.

Referring to FIG. 5, at process step S530, an embedded hard mask can be formed on the 3D memory structure 800. A cross-sectional view and a top-down view of an exemplary 3D memory structure 900A are shown in FIGS. 9A and 9B, respectively, according to the process steps S530.

Figure 9A:
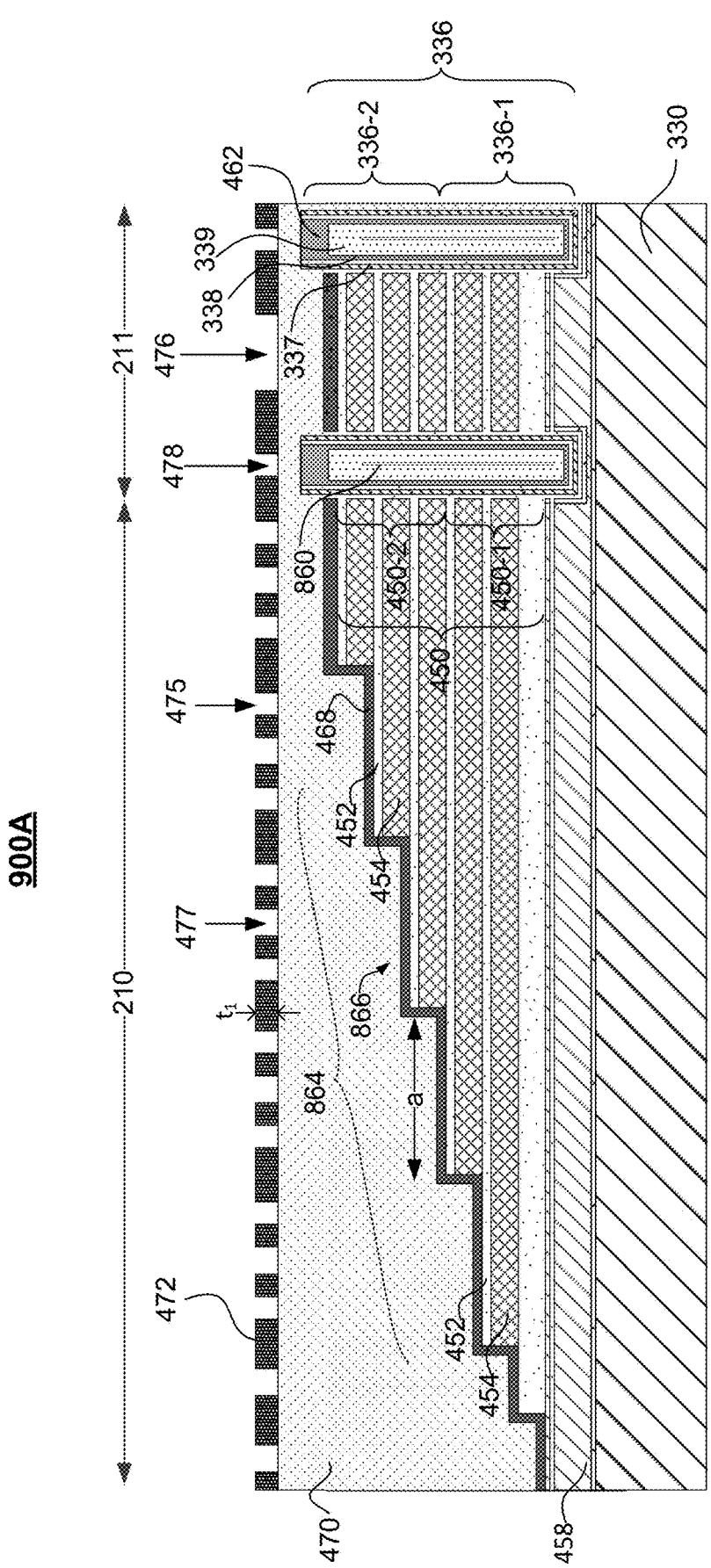
FIGS. 9A and 9B illustrate a cross-sectional view and a top-down view of the 3D memory device in FIG. 4A at certain process step, respectively, according to some embodiments of the present disclosure.
Figure 9B:
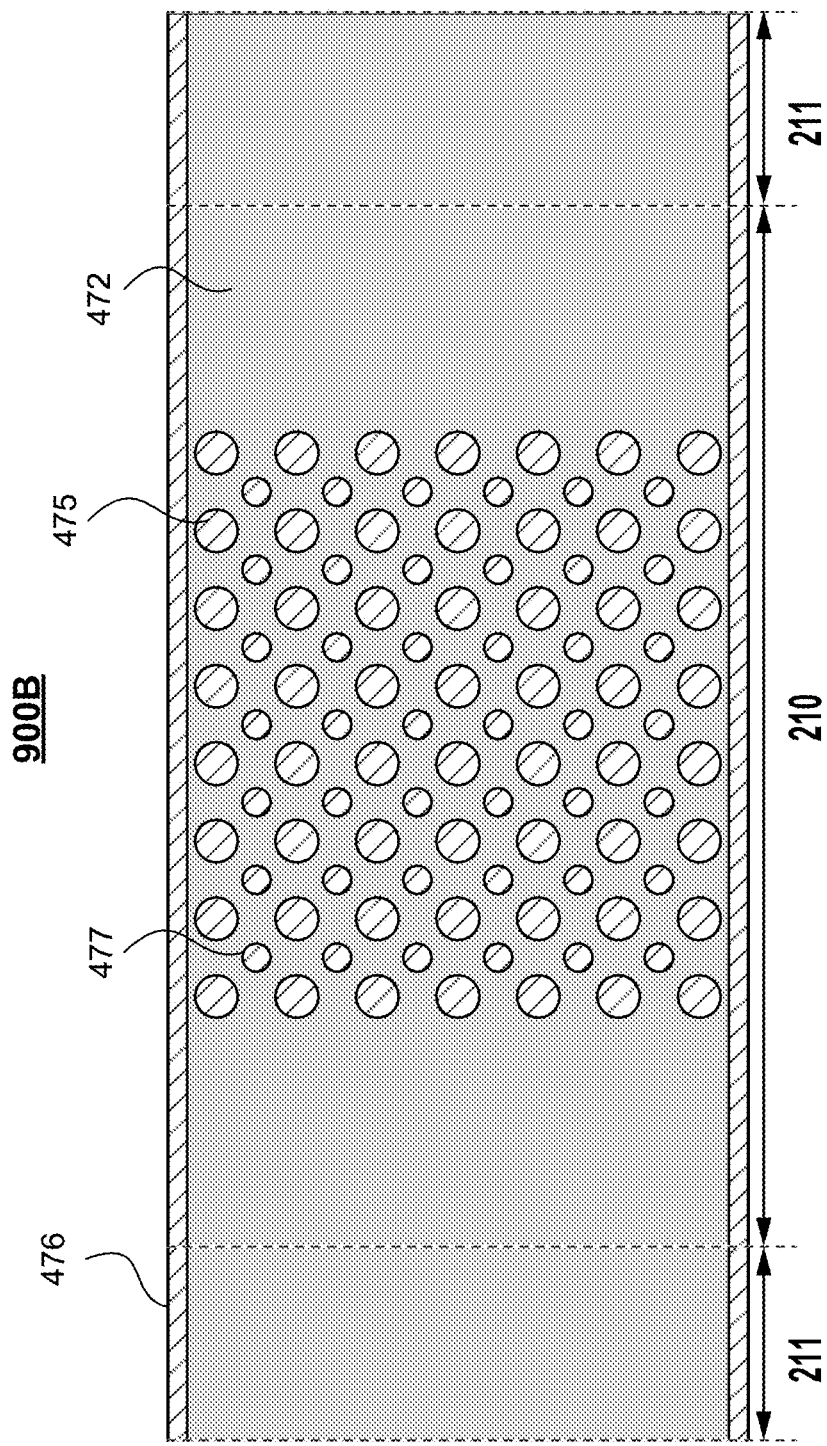

As shown in FIG. 9A, the embedded hard mask 472 can be disposed on the insulating layer 470. The embedded hard mask 472 can be any suitable material that withstands subsequent high temperature processes (e.g., >600° C.) such that dimensions and shapes of the embedded hard mask 472 are not changed under such a high temperature and there is no reactions take place in the embedded hard mask 472 under such a high temperature. The embedded hard mask 472 can include dielectric material such as silicon oxide, silicon nitride, silicon oxynitride, high-k dielectric film (e.g., hafnium oxide, zirconium oxide, aluminum oxide, tantalum oxide, or lanthanum oxide, etc.), and/or any combination thereof. The disposing of the embedded hard mask 472 can include any suitable techniques for thin film deposition. For example, the embedded hard mask 472 can be deposited by CVD, PVD, PECVD, LPCVD, RTCVD, MOCVD, ALD, HDP-CVD, etc. The embedded hard mask 472 can also be disposed on the insulating layer 470 by sputtering, evaporation, thermal oxidation, nitridation, any suitable furnace process, and/or any combination thereof. The embedded hard mask 472 can include a thickness "$t_1$" in a range between about 10 nm to about 1000 nm (e.g., $t_1$ can be about 50 nm, 100 nm or 300 nm).

The forming of the embedded hard mask 472 can include a patterning process such as lithography and etching. The lithography process can include photolithography, e-beam lithography, x-ray lithography, ion beam lithography, and/or a combination thereof. The photolithography process can include short wavelengths of light such as deep ultraviolet (DUV) of 248 nm or 193 nm, and/or extreme ultraviolet (EUV). The lithography process can also include using a lithography apparatus with optical equipment improvements, for example, lenses with higher numerical apertures, immersion techniques, off-axis illumination and/or the use of multiple sources. Additionally, computational lithography can further enhance patterning capability using existing lithography systems. The lithography process can further include a phase-shifting photomask and/or a photomask with optical proximity correction. In addition to photoresist, anti-reflective coatings can be used to improve lithography quality and reduce minimum feature size.

The etching process to form the embedded hard mask 472 can include a dry etching, a wet etching, or a combination thereof. In some embodiments, the embedded hard mask 472 can be etched using an anisotropic etching such as a reactive ion etch (ME). In some embodiments, fluorine or chlorine based gases such as carbon-fluorine ($CF_4$), hexafluoroethane ($C_2F_6$), $CHF_3$, $C_3F_6$, $C_{12}$, $BCl_3$, etc., or any combination thereof, can be used. In some embodiments, the etching process can also include a trimming step (e.g., laterally etching the photoresist and/or the hard mask) prior to etching vertically to shrink a critical dimension (CD) laterally.

The embedded hard mask 472 can also be patterned using double patterning technique, where dense patterns can be split into two interleaved patterns of less-dense features using two lithography masks followed by a litho-etch, litho-etch (LELE) process. The embedded hard mask 472 can also be patterned using self-aligned double patterning or spacer-assisted double patterning, where critical dimensions can be determined by the spacers surrounding a source element or a mandrel. The methods and etchants to pattern the embedded hard mask 472 should not be limited by the embodiments of the present disclosure.

During the manufacturing of integrated circuits (e.g., a 3D NAND flash memory), circuits are laid out with sets of patterns that can be sequentially transferred to the substrate (e.g., a silicon wafer) through the use of lithography processes and a set of lithography masks (or reticles). A set of patterns that can be created simultaneously on the substrate can be designed onto the same reticle. For example, patterns correspond to contact structures for word lines can be designed using one reticle and can be transferred to the silicon wafer through the same process steps. Patterns for structures, for example channel holes, slit structures, contact structures for word lines and bit lines, are usually designed onto different reticles because these features are formed using different processes (e.g., different etching, different material deposition, etc.). Alignment between different set of patterns formed with different reticles can be controlled through lithography overlay. However, previously created patterns can be deformed due to stress induced at a later process, for example a high temperature process. Critical dimensions of previously created patterns can also be changed during the subsequent processes, for example, wet etching. Accordingly, it can be difficult to achieve target overlay and CD tolerances by using many reticles and lithography steps.

The present disclosure provides a method for forming multiple sets of patterns at the same time through the embedded hard mask 472, where the multiple sets of patterns are otherwise designed with multiple reticles and created at different process steps (e.g., lithography processes and etching processes). As shown in FIGS. 9A and 9B, the embedded hard mask 472 can include multiple sets of patterns configured to define multiple sets of vertical structures of the 3D memory device, where the multiple sets of vertical structures are fabricated sequentially and can have different depth and/or materials. For example, the embedded hard mask 472 includes the first set of patterns 475 associated with the dummy channel holes 488 (in FIG. 4), the second set of patterns 476 associated with GLS 216, the third set of patterns 477 associated with the SSCTs 214, and the fourth set of patterns 478 associated with the bit line contacts 413. The embedded hard mask 472 can also include other patterns and features, which are not limited to the example shown here. The first set of patterns 475, the second set of patterns 476, the third set of patterns 477, the fourth set of patterns 478, . . . , can have different CDs and shapes.

Referring to FIG. 5, at process step S535, a sacrificial hard mask can be formed over the embedded hard mask. A cross-sectional view of an exemplary 3D memory structure 900C is shown in FIG. 9C according to the process step S535.

Figure 9C:
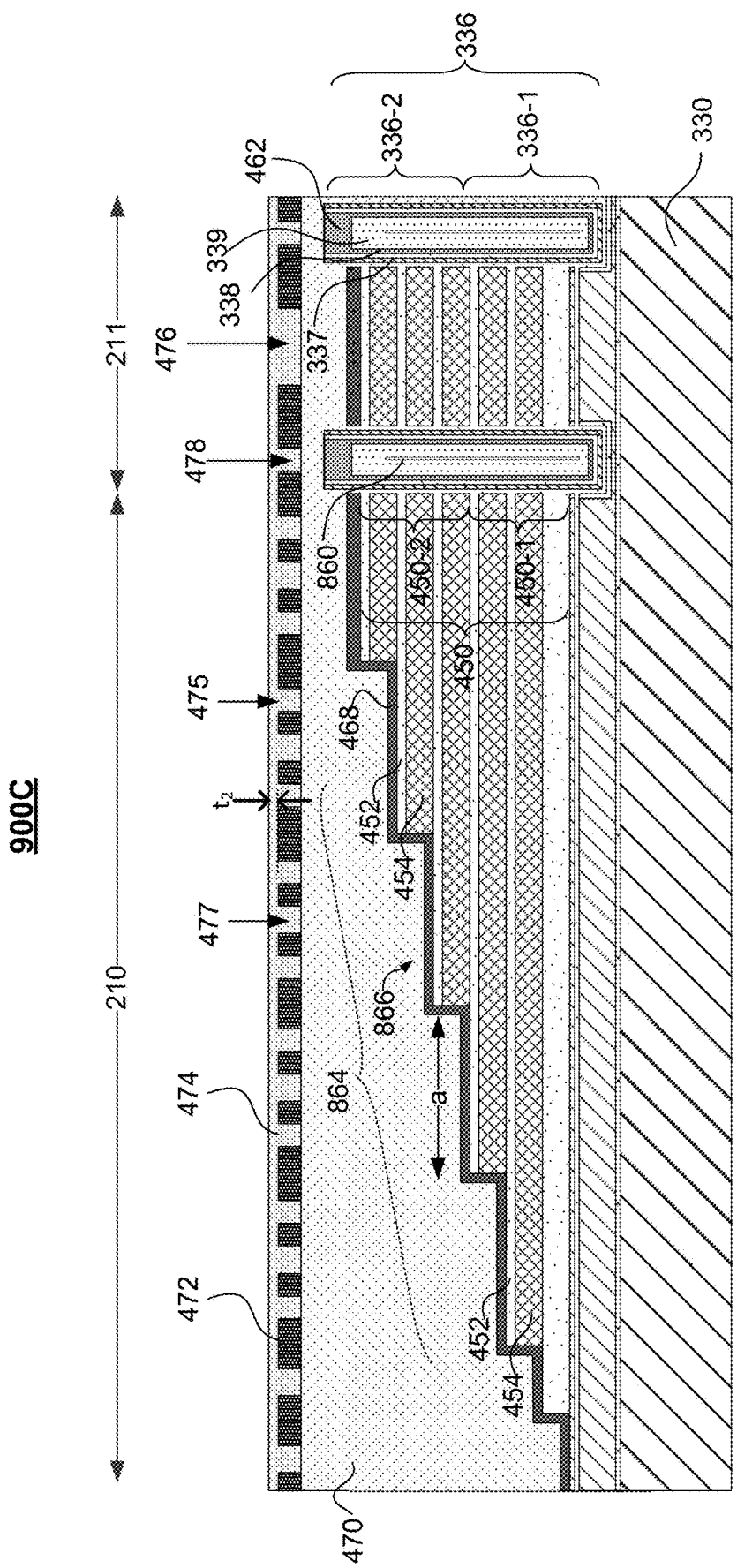
FIG. 9C illustrates a cross-sectional view of the 3D memory device in FIG. 4A at certain process step, respectively, according to some embodiments of the present disclosure.

As shown in FIG. 9C, a sacrificial hard mask 474 can be disposed on the embedded hard mask 472. The sacrificial hard mask 474 can be any suitable material that withstands subsequent high temperature processes (e.g., >600° C.), wherein the sacrificial hard mask 474 includes material different from the embedded hard mask 472. The sacrificial hard mask 474 can include dielectric material such as silicon oxide, silicon nitride, silicon oxynitride, TEOS, etc., and/or any combination thereof. In some embodiments, the sacrificial hard mask 474 can be silicon oxide. The sacrificial hard mask 474 can be disposed on the embedded hard mask 472 by using any suitable techniques, for example, CVD, PVD, PECVD, LPCVD, RTCVD, MOCVD, ALD, HDP-CVD, sputtering, evaporation, and/or any combination thereof. The sacrificial hard mask 474 can fill up gaps or openings between the multiple patterns of the embedded hard mask 472.

After forming the sacrificial hard mask 474, the embedded hard mask 472 is embedded (i.e., enclosed) in the 3D memory structure 900C. As such, the embedded hard mask 472 can be protected through various subsequent fabrication processes. In this example, the embedded hard mask 472 is covered by the sacrificial hard mask 474. Particularly, the multiple sets of patterns (e.g., the first/second/third/fourth sets of patterns 475/476/477/478) formed in the embedded hard mask 472 can be filled and covered by the sacrificial hard mask 474.

The forming of the sacrificial hard mask 474 can also include a planarization process, for example, RIE etch-back and/or chemical mechanical polishing (CMP) such that the sacrificial hard mask 474 can have a planar (i.e. leveled or flat) surface. The sacrificial hard mask 474 can have a thickness "$t_2$" above the embedded hard mask 472 in a range between 10 nm and 100 nm (e.g., $t_2$ can be about 20 nm, 50 nm or 70 nm).

Referring to FIG. 5, at process step S540, a first set of openings for dummy channel holes (DCHs) can be formed over the embedded hard mask. A cross-sectional view and a top-down view of an exemplary 3D memory structure 1000 are shown in FIGS. 10A and 10B according to the process step S540.

Figure 10A:
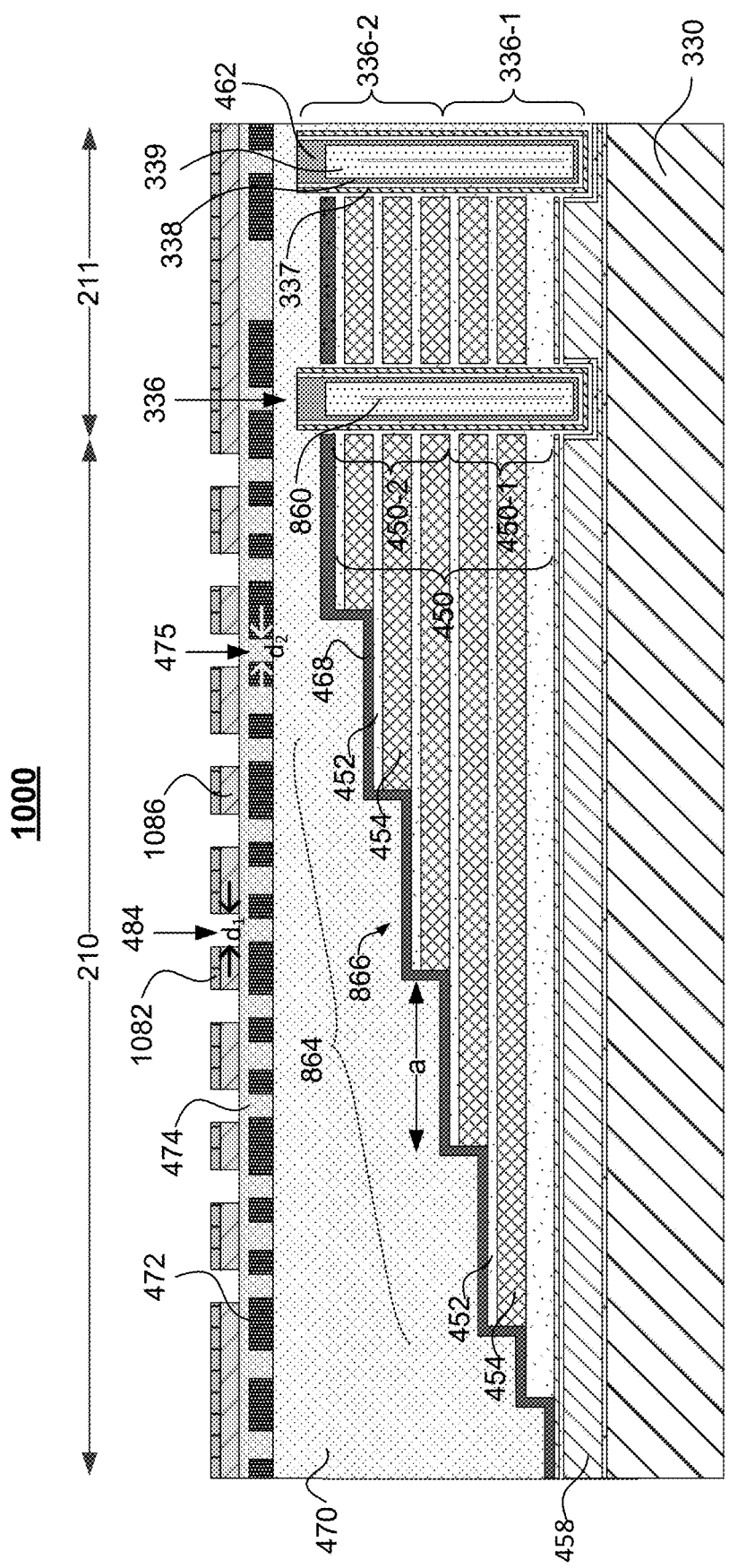

As shown in FIG. 10A, the 3D memory structure 1000 includes the first set of openings 484 formed on the sacrificial hard mask 474. The first set of openings 484 are designed to form the DCHs 488 (in FIG. 4) in subsequent processes. The first set of openings 484 can be disposed in the staircase region 210, as depicted in FIG. 10B.

The forming of the first set of openings 484 includes disposing and patterning a DCH resist mask 1082 and a DCH hard mask 1086 on the sacrificial hard mask 474 and the embedded hard mask 472. In some embodiments, the DCH hard mask 1086 is optional and can be omitted.

The DCH resist mask 1082 can be any suitable photoresist, e-beam resist, etc., to facilitate lithography process, where the first set of openings 484 can be transferred from a reticle (or lithography mask) to the DCH resist mask 1082. The DCH hard mask 1086 can be any suitable hard mask, for example, silicon oxide, silicon nitride, TEOS, silicon-containing anti-reflective coating (SiARC), amorphous silicon, or polycrystalline silicon, spin-on-glass, or any combination thereof. In some embodiments, the DCH hard mask 1086 can also include a carbon-based polymer material. The patterning process to form the DCH hard mask 1086 can include a dry etching, a wet etching, or a combination thereof.

The first set of openings 484 can be substantially aligned with the first set of patterns 475 in the embedded hard mask 472. Because the embedded hard mask 472 and the sacrificial hard mask 474 can serve as additional mask for subsequent etching process, the DCH hard mask 1086 can have a reduced thickness such that improved visibility of the first set of patterns 475 can provide better overlay control during lithography process. In some embodiments, the DCH hard mask 1086 can have a thickness in a range between 10 nm to 50 nm. Additionally, the first set of patterns 475 have been formed previously and are covered and protected by the sacrificial hard mask 474, CDs, pitches, shapes of the first set of patterns 475 are not affected by any processes implemented prior to the DCH hard mask 1086 patterning. As such, the overlay from the first set of openings 484 to the first set of patterns 475 can be controlled to a target tolerance range. Additionally, the CDs of the first set of patterns 475 can be used to determine the CDs of the DCHs instead of using the CDs of the first set of openings 484. In some embodiments, the first set of openings 484 can have CDs "$d_1$" larger than CDs "$d_2$" of the first set of patterns 475.

Referring to FIG. 5, at process step S545, a plurality of DCH openings can be formed through the first set of openings. Cross-sectional view of an exemplary 3D memory structure 1100 is shown in FIG. 11, according to the process step S545.

Figure 11:
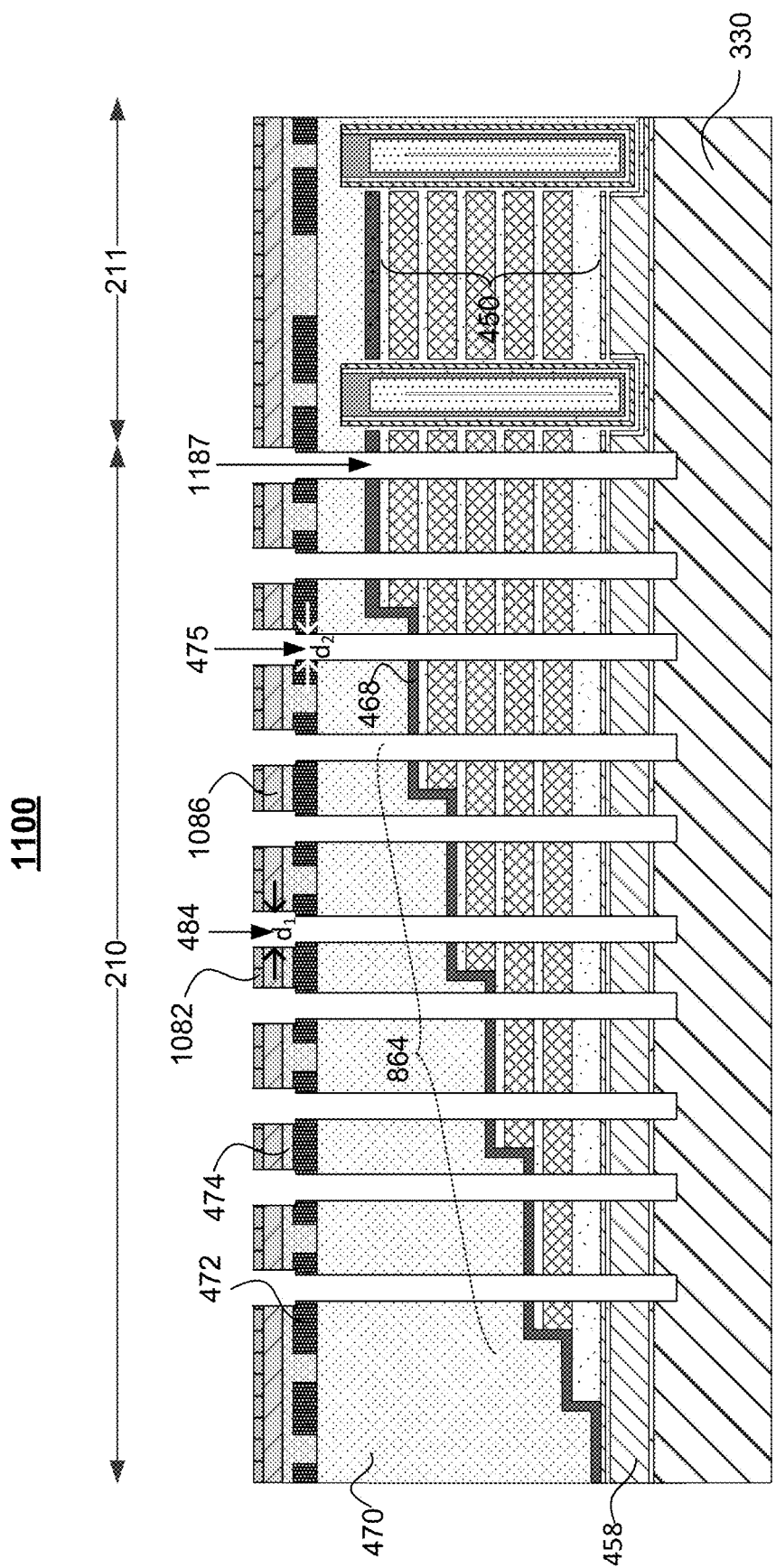
FIG. 11 illustrates a cross-sectional view of the 3D memory device in FIG. 4A at certain process step, according to some embodiments of the present disclosure.

As shown in FIG. 11, the 3D memory structure 1100 includes a plurality of DCH openings 1187 extending vertically through the alternating dielectric stack 450. In some embodiments, the DCH openings 1187 extends into the semiconductor layer 458 and can further extend into the substrate 330. The DCH openings 1187 locate in the staircase region 210 and are configured to form DCHs 488 (in FIG. 4) to provide mechanical support for 3D memory structures during subsequent processes.

The forming of the DCH openings 1187 includes etching through portions of the sacrificial hard mask 474 exposed inside the first set of openings 484, such that the first set of openings 484 can be transferred from the DCH resist mask 1082 and the DCH hard mask 1086 to the sacrificial hard mask 474.

Next, portions of the sacrificial hard mask 474 inside the first set of patterns 475 of the embedded hard mask 472 can be removed, followed by etching through the insulating layer 470 and the alternating dielectric stack 450. The forming of the DCH openings 1187 also includes etching through the barrier layer 468. The etching processes used to form the DCH openings 1187 can include dry etching, wet etching, and/or a combination thereof. In some embodiments, the etching processes for the DCH openings 1187 include an anisotropic etching such as ME.

As discussed previously with respect to FIG. 10A, the first set of openings 484 can have the CDs "$d_1$" larger than the CDs "$d_2$" of the first set of patterns 475. In this example, CDs of the DCH openings 1187 (or diameters of the DCHs 488 in FIG. 4) can be determined by the CDs "$d_2$" of the first set of patterns 475 formed by the embedded hard mask 472. For example, portions of the sacrificial hard mask 474 inside the first set of openings 484 can be removed by a selective etching process where etching rate of the sacrificial hard mask 474 can be much higher than the embedded hard mask 472. As a result, portions of the embedded hard mask 472 exposed inside the first set of openings 484 can remain largely intact, where the CDs "$d_2$" and shapes of the first set of patterns 475 are not changed.

In some embodiments, etching processes through the insulating layer 470 and the alternating dielectric stack 450 can also be a selective etching process such that etching rates of the insulating layer 470 and the alternating dielectric stack 450 are much higher than the DCH resist mask 1082, the DCH hard mask 1086, the sacrificial hard mask 474 and the embedded hard mask 472. Accordingly, minimum erosion takes place in the DCH resist mask 1082, the DCH hard mask 1086, the sacrificial hard mask 474 and the embedded hard mask 472. In some embodiments, the DCH openings 1187 can be formed by relying on the embedded hard mask 472 when etching through the insulating layer 470 and/or the alternating dielectric stack 450 where the DCH resist mask 1082, the DCH hard mask 1086 and/or the sacrificial hard mask 474 can be eroded away during the etching process. In the other words, the DCH openings 1187 can be formed by relying on the portion of the embedded hard mask 472 exposed inside the first set of openings 484, where the CDs "$d_2$" of the first set of patterns 475 can be smaller than the CDs "$d_1$" of the first set of openings 484. Therefore, patterning processes (lithography and/or etching) for the DCH hard mask 1086 and the DCH resist mask 1082 can be relaxed. In addition to larger CDs of the first set of openings 484, overlay tolerance between the first set of openings 484 and the first set of patterns 475 can also be relaxed such that a slight miss-alignment does not affect the forming of the DCH openings 1187, as long as the portions of the sacrificial hard mask 474 inside the first set of patterns 475 can be removed prior to the etching of the insulating layer 470 and the alternating dielectric stack 450.

Referring to FIG. 5, at process step S550, DCH fillers can be disposed inside the DCH openings to form DCHs. A cross-sectional view of an exemplary 3D memory structure 1200 is shown in FIG. 12, according to the process step S550.

Figure 12:
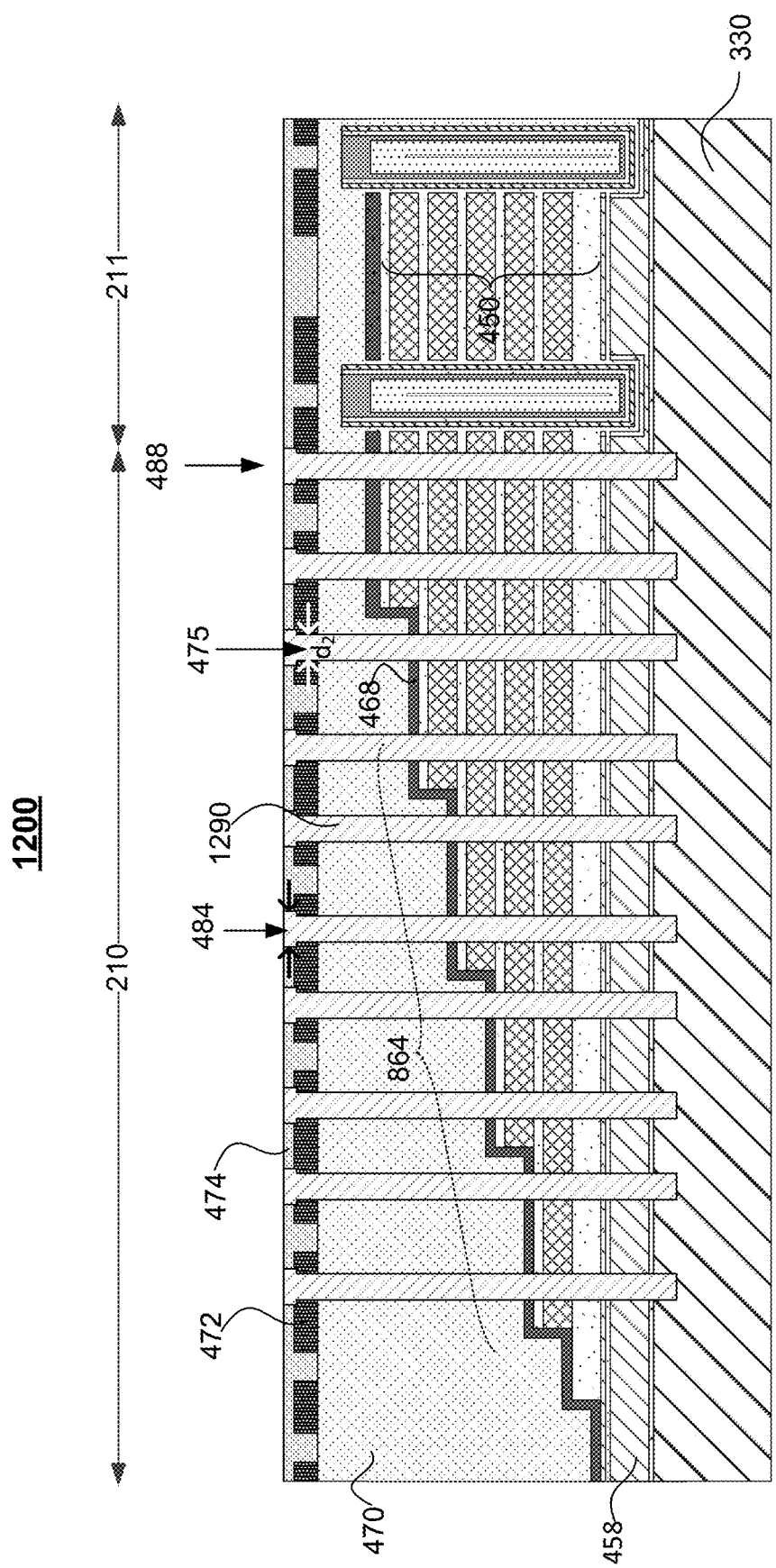
FIG. 12 illustrates a cross-sectional view of the 3D memory device in FIG. 4A at certain process step, according to some embodiments of the present disclosure.

As shown in FIG. 12, the DCHs 488 each includes a DCH filler 1290, wherein the DCH filler 1290 includes any suitable insulator, for example, silicon oxide, silicon nitride, silicon oxynitrde, TEOS, high-k dielectric material ($Al_2O_3$, $HfO_2$, $Ta_2O_3$, $ZrO_2$, $La_2O_3$, etc), or any combination thereof. The DCH filler 1290 can be disposed by any suitable thin film deposition techniques such as CVD, ALD, PVD, sputtering, evaporation, etc.

In some embodiments, the DCH resist mask 1082 and the DCH hard mask 1086 can be stripped off prior to the deposition of the DCH filler 1290.

In some embodiments, the DCH filler 1290 can be planarized to form DCHs 488 having coplanar surfaces with the sacrificial hard mask 474. The planarization process includes RIE etch back or CMP.

As discussed previously, critical dimension of DCHs 488 can be determined by the first set of patterns 475 in the embedded hard mask 472 with the CD "$d_2$." The first set of openings 484 can be transferred into the sacrificial hard mask 474 with the CD "$d_1$" larger than the CD "$d_2$". Accordingly, the DCHs 488 can have a "T" shape, where the head of the "T" shape located inside the sacrificial hard mask 474.

Referring to FIG. 5, at process step S555, a second set of openings can be formed for slit structures (also referred to gate line slits, or GLSs). A cross-sectional view and a top-down view of an exemplary 3D memory structure 1300A are shown in FIGS. 13A and 13B, respectively, according to the process step S555.

Figure 13A:
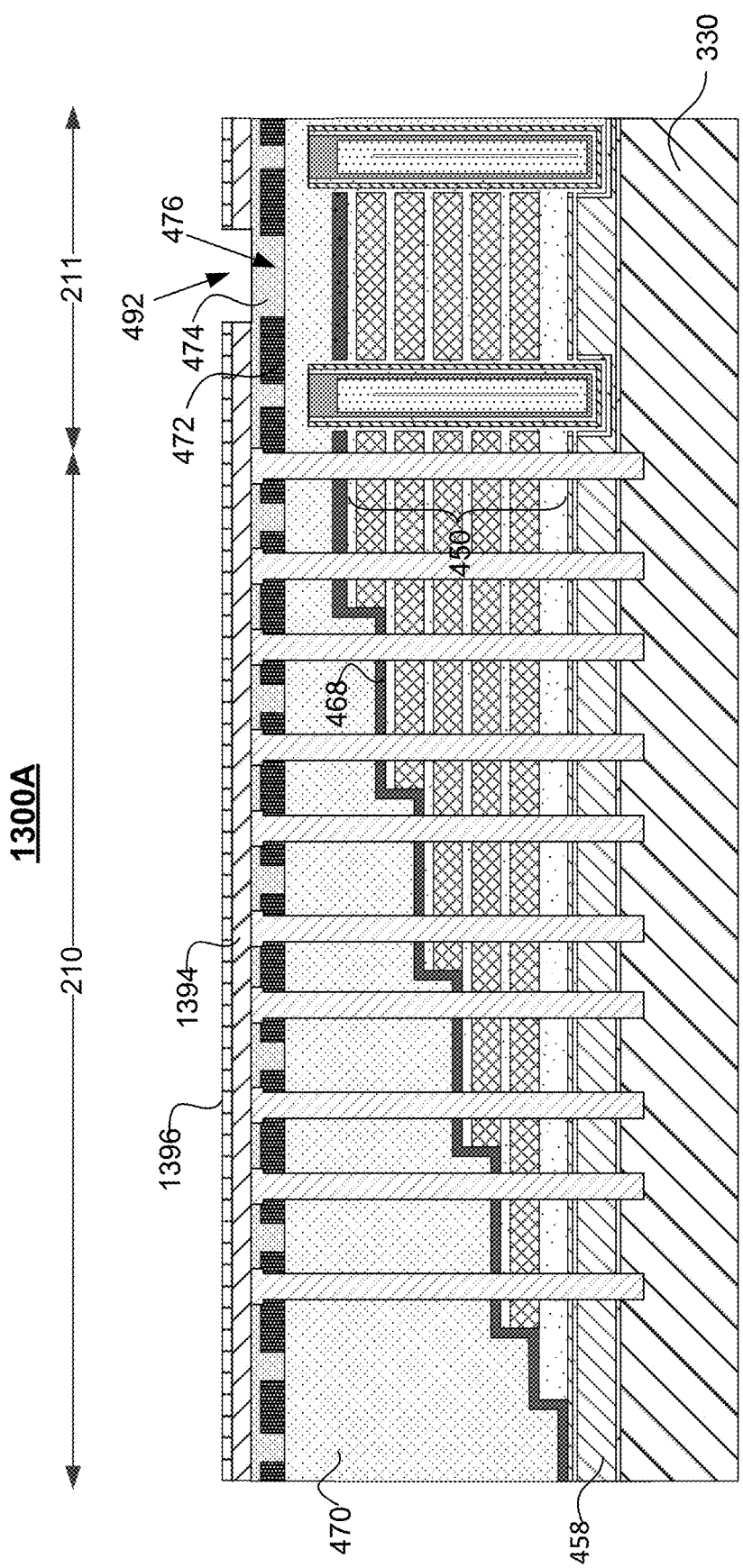

As shown in FIG. 13A, the 3D memory structure 1300A includes a second set of openings 492 formed on the sacrificial hard mask 474 and the embedded hard mask 472. The second set of openings 492 are designed to form the GLSs 216 (in FIG. 4) in subsequent processes. The second set of openings 492 can be disposed across the channel structure region 211 and the staircase region 210, as depicted in FIG. 13B. The configuration of the cross-sectional view of the second set of openings 492 in FIG. 13A is for illustration purpose.

The forming of the second set of openings 492 includes disposing and patterning a GLS resist mask 1396 and a GLS hard mask 1394 on the sacrificial hard mask 474 and the embedded hard mask 472. In some embodiments, the GLS hard mask 1394 is optional and can be omitted.

The GLS resist mask 1396 can be similar to the DCH resist mask 1082 and can be disposed and patterned using similar techniques. The GLS hard mask 1394 can be similar to the DCH hard mask 1086 and can be disposed and patterned using similar techniques.

The second set of openings 492 can be substantially aligned with the second set of patterns 476 in the embedded hard mask 472. Similar to the first set of openings 484, the second set of openings 492 can have CDs larger than those of the second set of patterns 476. Like the DCH formation, CDs of the second set of patterns 476 can be used to determine the CDs of the GLSs instead of using the CDs of the second set of openings 492. Because the second set of patterns 476 in the embedded hard mask 472 have been formed previously and are covered and protected by the sacrificial hard mask 474, CDs, pitches, shapes of the second set of patterns 476 are not affected by any processes implemented prior to the patterning process for the GLS hard mask 1394. Also, the GLS hard mask 1394 can have a reduced thickness because the embedded hard mask 472 and the sacrificial hard mask 474 can serve as additional mask for subsequent etching process. The second set of patterns 476 can be more visible during lithography process so as to improve overlay. As such, the overlay from the second set of openings 492 to the second set of patterns 476 can be controlled to a target tolerance range.

Referring to FIG. 5, at process step S560, a plurality of gate line slit (GLS) openings can be formed through the second set of openings. Cross-sectional view of an exemplary 3D memory structure 1300C is shown in FIG. 13C, according to the process step S560.

Figure 13C:
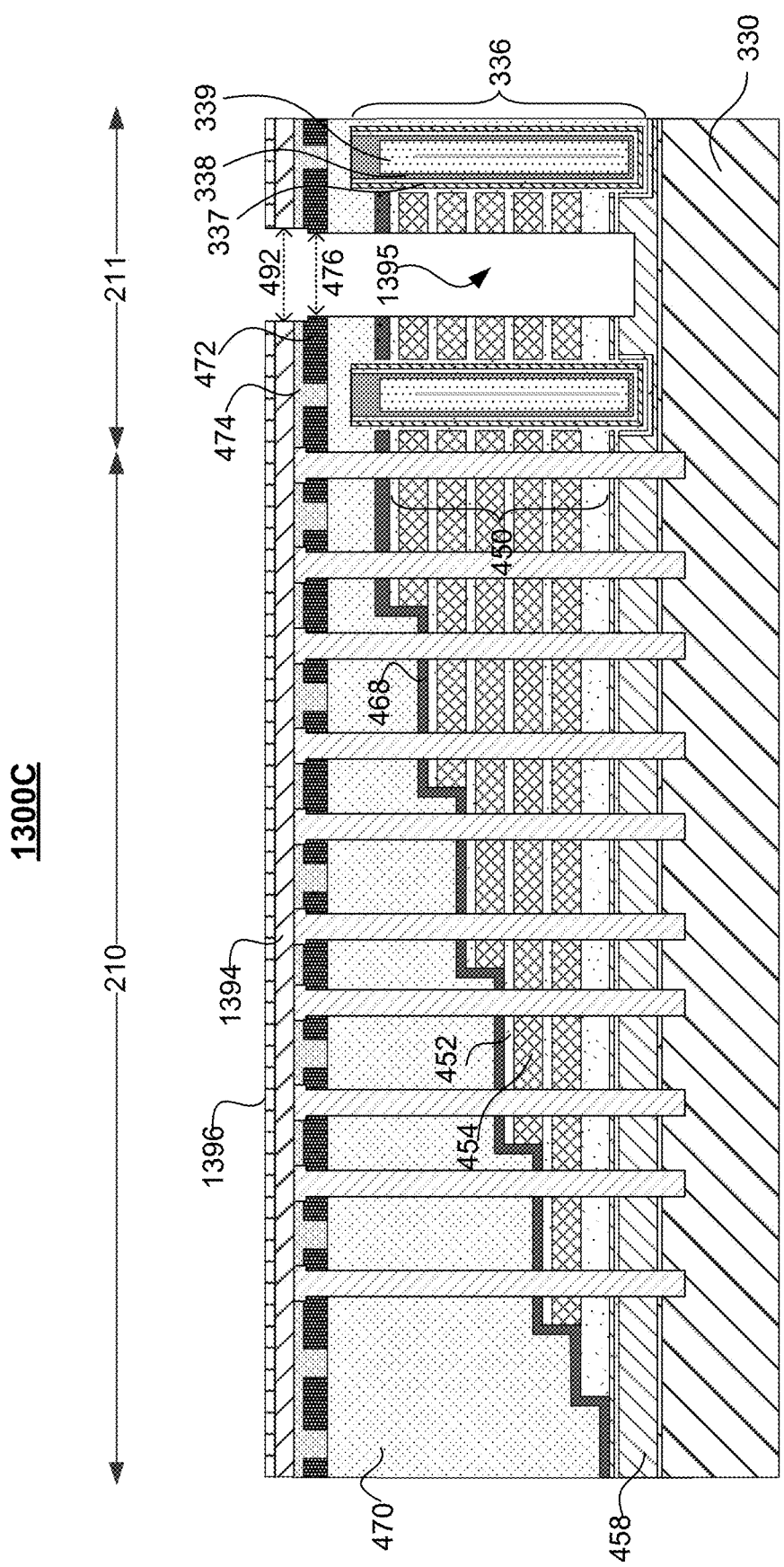
FIG. 13C illustrates a cross-sectional view of the 3D memory device in FIG. 4A at certain process step, according to some embodiments of the present disclosure.

As shown in FIG. 13C, the 3D memory structure 1300C includes a GLS opening 1395 penetrating vertically through the insulating layer 470 and the alternating dielectric stack 450. In some embodiments, the GLS opening 1395 extends into the semiconductor layer 458. In some embodiments, the GLS opening 1395 extends further into the substrate 330. The GLS opening 1395 can be formed by a suitable etching process, for example, dry etching, wet etching, or a combination thereof. In one example, the etching process of the GLS opening 1395 can be similar to the etching process for the DCHs 488 described previously. As shown in FIGS. 2 and 13B, The GLS opening 1395 separates a memory block into multiple memory fingers.

The forming of the GLS opening 1395 includes etching through portions of the sacrificial hard mask 474 exposed inside the second set of openings 492, where the second set of openings 492 can be transferred into the sacrificial hard mask 474. The forming of the GLS opening 1395 also includes etching through the insulating layer 470 and the alternating dielectric stack 450. The forming of the GLS opening 1395 can also include etching through the barrier layer 468. The etching processes used to form the GLS opening 1395 can include dry etching, wet etching, and/or a combination thereof. In some embodiments, the etching processes for the GLS opening 1395 include an anisotropic etching such as RIE. Similar to the etching processes for DCHs 488 as discussed previously, the etching processes for GLS opening 1395 can also be a selective etching process such that etching rates of the insulating layer 470 and the alternating dielectric stack 450 are much higher than the GLS resist mask 1396, the GLS hard mask 1394, the sacrificial hard mask 474 and the embedded hard mask 472. Accordingly, minimum erosion takes place in the GLS resist mask 1396, the GLS hard mask 1394, the sacrificial hard mask 474 and the embedded hard mask 472.

Similar to the etching processes for DCHs 488 as discussed previously, the GLS opening 1395 can be formed by relying on the embedded hard mask 472 when etching through the insulating layer 470 and/or the alternating dielectric stack 450 where the GLS resist mask 1396, the GLS hard mask 1394 and/or the sacrificial hard mask 474 can be eroded away during the etching process. In the other words, the GLS opening 1395 can be formed by relying on the portion of the embedded hard mask 472 exposed inside the second set of openings 492, where the CDs of the second set of patterns 476 can be smaller than the CDs of the second set of openings 492. Similarly, overlay tolerance between the second set of openings 492 and the second set of patterns 476 can also be relaxed such that a slight miss-alignment does not affect the forming of the GLS opening 1395, as long as the portions of the sacrificial hard mask 474 inside the second set of patterns 476 can be removed prior to the etching of the insulating layer 470 and the alternating dielectric stack 450.

After forming the GLS opening 1395, remaining GLS resist mask 1396 and GLS hard mask 1394 can be stripped off.

Referring to FIG. 5, at process step S565, a film stack of alternating conductive and dielectric layers can be formed. A cross-sectional view of an exemplary 3D memory structure 1400 is shown in FIG. 14, according to the process step S565.

Figure 14:
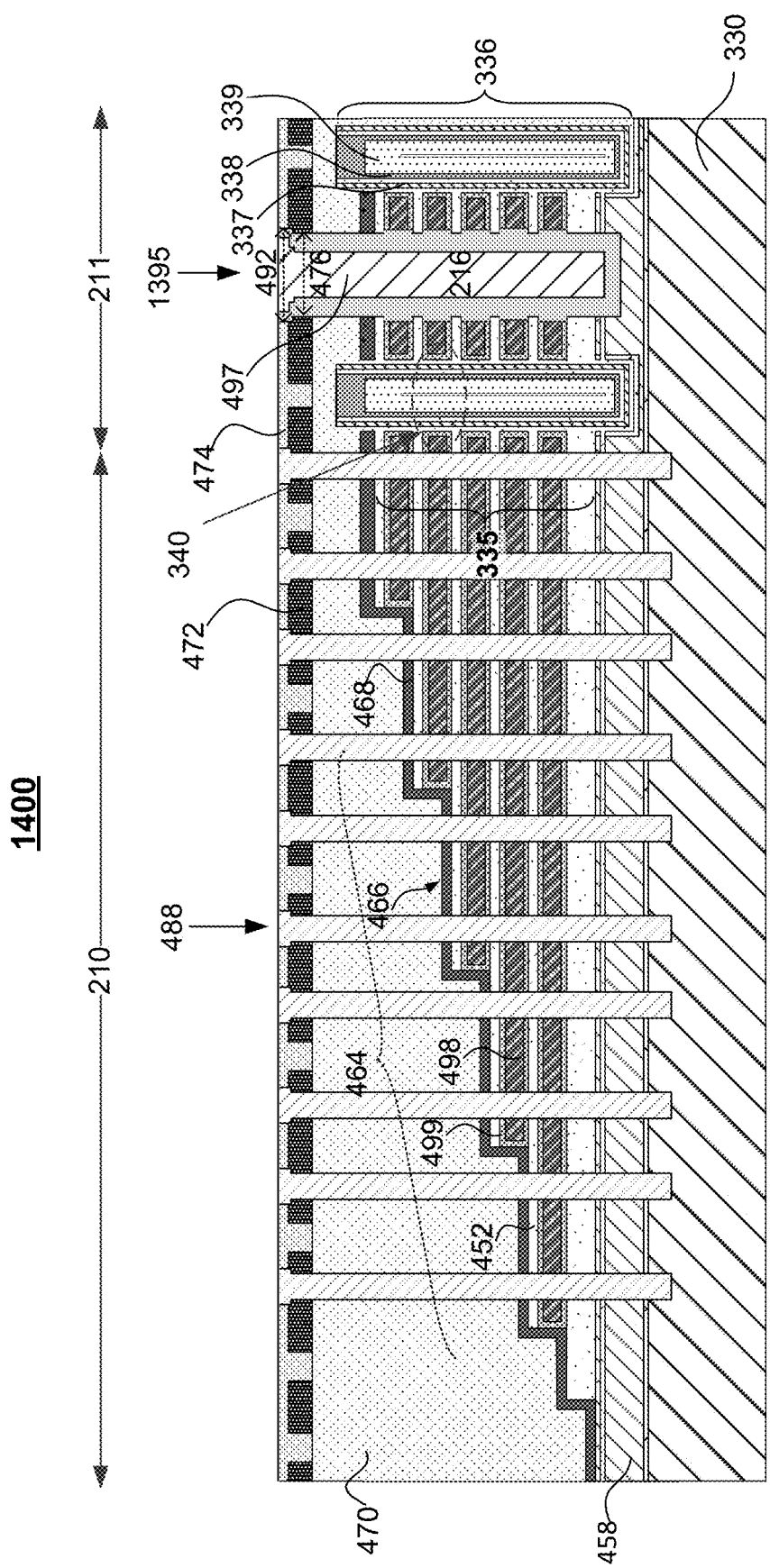
FIG. 14 illustrates a cross-sectional view of the 3D memory device in FIG. 4A at certain process step, according to some embodiments of the present disclosure.

As shown in FIG. 14, the 3D memory structure 1400 includes the film stack 335 of alternating conductive and dielectric layers having the first dielectric layer 452 and the conductive layer 498. The film stack 335 can be formed by replacing the second dielectric layers 454 in the 3D memory structure 1300C (in FIG. 13C) with the conductive layers 498. After forming the film stack 335, the staircase structure 864 (shown in FIG. 8A) having the first dielectric layers 452 and the second dielectric layers 454 becomes the staircase structure 464 (also shown in FIG. 4A) having the first dielectric layers 452 and the conductive layers 498. Similarly, the staircase step 866 (shown in FIG. 8A) becomes the staircase step 466.

As an example, a plurality of lateral tunnels (not shown) can be formed first by removing the second dielectric layers 454 (in FIG. 13C), selectively from the first dielectric layers 452. The second dielectric layers 454 can be selectively removed by an isotropic dry etch and/or wet etch through the GLS opening 1395 (see FIG. 13C), where the plasma or chemical can travel vertically and laterally from the GLS opening 1395. In some embodiments, the second dielectric layer 454 can be silicon nitride. In this example, the second dielectric layer 454 can be removed by RIE using one or more etchants of $CF_4$, $CHF_3$, $C_4F_8$, $C_4F_6$, and $CH_2F_2$, etc. In some embodiments, the second dielectric layer 454 can be removed using wet etch, such as phosphoric acid. After the second dielectric layers 454 are removed, portions of the memory film 337 in the channel holes 336 can be exposed laterally in the lateral tunnels.

After removing the second dielectric layers 454 and forming the lateral tunnels, the conductive layers 498 can be disposed in between adjacent first dielectric layers 452. In some embodiments, the conductive layers 498 can be formed by filling the lateral tunnels with a suitable conductive material. The conductive material for the conductive layers 498 can include metal or metal alloys such as tungsten (W), aluminum (Al), titanium (Ti), copper (Cu), cobalt (Co), nickel (Ni), titanium nitride (TiN), tungsten nitride (WN), tantalum (Ta), tantalum nitride (TaN), AlTi, or any combination thereof. In some embodiments, the conductive material for the conductive layers 498 can also include poly-crystalline semiconductors, such as poly-crystalline silicon, poly-crystalline germanium, poly-crystalline germanium-silicon and any other suitable material, and/or combinations thereof. In some embodiments, the poly-crystalline material can be incorporated with any suitable types of dopant, such as boron, phosphorous, arsenic, or any combination thereof. In some embodiments, the conductive layers 498 can also include amorphous semiconductors such as amorphous silicon. In some embodiments, the conductive layers 498 can be disposed inside the lateral tunnels using a suitable deposition method such as CVD (LPCVD, PECVD, MOCVD, RTCVD, etc.), PVD, sputtering, evaporation, ALD, or any combination thereof. In some embodiments, the conductive layers 498 include tungsten (W) deposited by CVD.

In some embodiments, the gate dielectric layer 499 can be disposed in the lateral tunnels prior to disposing the conductive layer 498. Therefore, the gate dielectric layer 499 can be disposed between the conductive layer 498 and the first dielectric layer 452 in the film stack 335, as well as between the conductive layer 498 and the memory film 337 along sidewalls of channel holes 336. The gate dielectric layer 499 can be used to reduce leakage current between adjacent conductive layers 498 that form word lines or gate electrodes. The gate dielectric layer 499 can also be used to reduce leakage current between the conductive layer 498 (e.g., as a control gate) and the channel of the memory cell (e.g., the channel layer 338). The gate dielectric layer 499 can include any suitable insulator, for example, silicon oxide, silicon nitride, silicon oxynitride, and/or any suitable combinations thereof. The gate dielectric layer 499 can also include high-k dielectric materials, such as hafnium oxide, zirconium oxide, aluminum oxide, tantalum oxide, lanthanum oxide, and/or any combination thereof. The gate dielectric layer 499 can be disposed by one or more suitable deposition processes, such as CVD, PVD, and/or ALD.

In some embodiments, the conductive layers 498 can be electrically connected to the lower select gate 332 (in FIG. 3), the plurality of control gates (or word lines) 333 or the top select gate 334. In some embodiments, the conductive layer 498 can function as the control gate 333, wherein the intersection between the control gate 333, the memory film 337 and the channel layer 338 forms the memory cell 340. The multiple stacked memory cells 340 along the sidewall of the same channel hole 336 forms the memory string 212.

In some embodiments, etching and cleaning processes can be used to remove excess conductive layers 498 on sidewalls of the GLS opening 1395. As such, each conductive layer 498 can be electrically isolated from each other. In some embodiments, the GLS filler 497 can be disposed inside the GLS openings 1395 to form the GLS (or slit structures) 216. The GLS filler 497 can be any suitable insulator, for example, silicon oxide, silicon nitride, silicon oxynitride, boron or phosphorus doped silicon oxide, carbon-doped oxide (CDO or SiOC or SiOC:H), or fluorine doped oxide (SiOF), or any combination thereof. The GLS filler 497 can be deposited by using, for example, ALD, CVD (e.g., PECVD, RTCVD, LPCVD, etc.), PVD, sputtering, evaporating, or any other suitable film deposition techniques.

In some embodiments, the 3D memory structure 1400 can have a planar top surface by using a planarization process after disposing the GLS filler 497. Any excess material of the GLS filler 497 and/or the conductive layer 498 outside the GLS 216 (e.g., on top of the sacrificial hard mask 474) can be removed by the planarization process. The planarization process can include RIE etch back and/or CMP.

As discussed previously, critical dimension of GLS 216 can be determined by the second set of patterns 476 in the embedded hard mask 472. The second set of openings 492 can be transferred into the sacrificial hard mask 474 with a CD larger than that of the second set of patterns 476. Accordingly, the GLS 216 can have a "T" shape, where the head of the "T" shape at least partly located inside the sacrificial hard mask 474.

Referring to FIG. 5, at process step S570, a third set of openings can be formed for staircase contacts, array common source contacts, and/or peripheral device contacts. A cross-sectional view and a top-down view of an exemplary 3D memory structure 1500 are shown in FIGS. 15A and 15B, according to the process step S570.

Figure 15A:
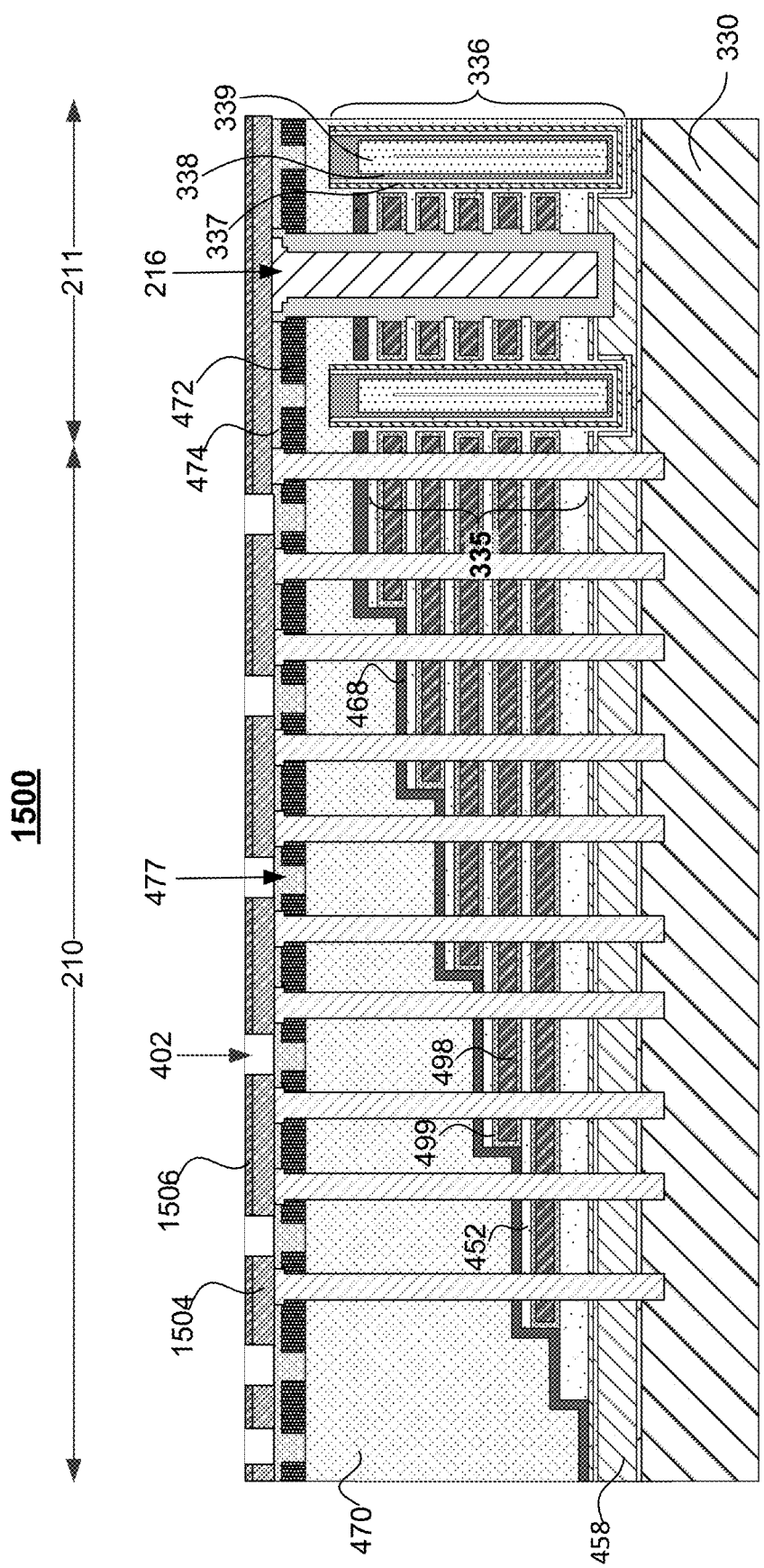
FIGS. 15A and 15B illustrate a cross-sectional view and a top-down view of the 3D memory device in FIG. 4A at certain process step, respectively, according to some embodiments of the present disclosure.
Figure 15B:
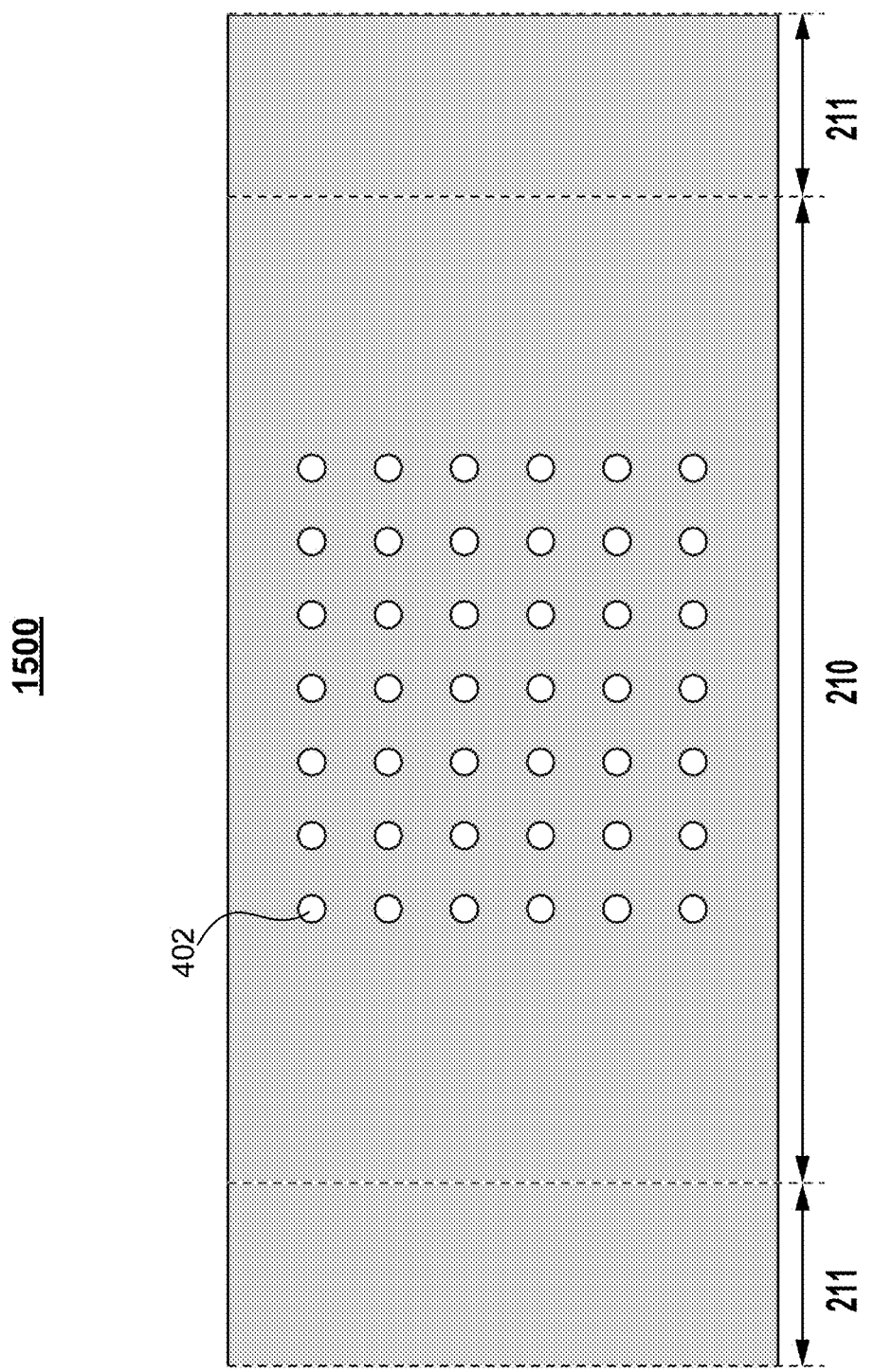

As shown in FIG. 15A, the 3D memory structure 1500 includes the third set of openings 402 formed on the sacrificial hard mask 474. The third set of openings 402 are designed to form the SSCTs 214 (in FIGS. 2-4), array common source (ACS) contacts 415 (in FIG. 4) and peripheral device contacts in subsequent processes. The third set of openings 402 can be disposed in the staircase region 210, as depicted in FIG. 15B. In some embodiments, the third set of openings 402 can also be disposed in the peripheral region 105 (in FIG. 1) for peripheral device contacts.

The forming of the third set of openings 402 includes disposing and patterning a SSCT resist mask 1506 and a SSCT hard mask 1504 on the sacrificial hard mask 474 and the embedded hard mask 472. In some embodiments, the SSCT hard mask 1504 is optional and can be omitted.

The SSCT resist mask 1506 can be similar to the DCH resist mask 1082 and can be disposed and patterned using similar techniques. The SSCT hard mask 1504 can be similar to the DCH hard mask 1086 and can be disposed and patterned using similar techniques.

The third set of openings 402 can be substantially aligned with the third set of patterns 477 in the embedded hard mask 472. Similarly, the third set of openings 402 can have CDs larger than those of the third set of patterns 477. Like the DCHs formation, CDs of the third set of patterns 477 can be used to determine the CDs of the staircase contacts, ACS contacts and/or peripheral device contacts, instead of using the CDs of the third set of openings 402. Because the third set of patterns 477 in the embedded hard mask 472 have been formed previously and are covered and protected by the sacrificial hard mask 474, CDs, pitches, shapes of the third set of patterns 477 are not affected by any processes implemented prior to the patterning processes for the SSCT hard mask 1504. Also, the SSCT hard mask 1504 can have a reduced thickness because the embedded hard mask 472 and the sacrificial hard mask 474 can serve as additional mask for subsequent etching process. The third set of patterns 477 can be more visible during lithography process. As such, the overlay from the third set of openings 402 to the third set of patterns 477 can be controlled to a target tolerance range.

Referring to FIG. 5, at process step S575, a plurality of SSCT openings can be formed through the third set of openings. A cross-sectional view of an exemplary 3D memory structure 1600 is shown in FIG. 16, according to the process step S575.

Figure 16:
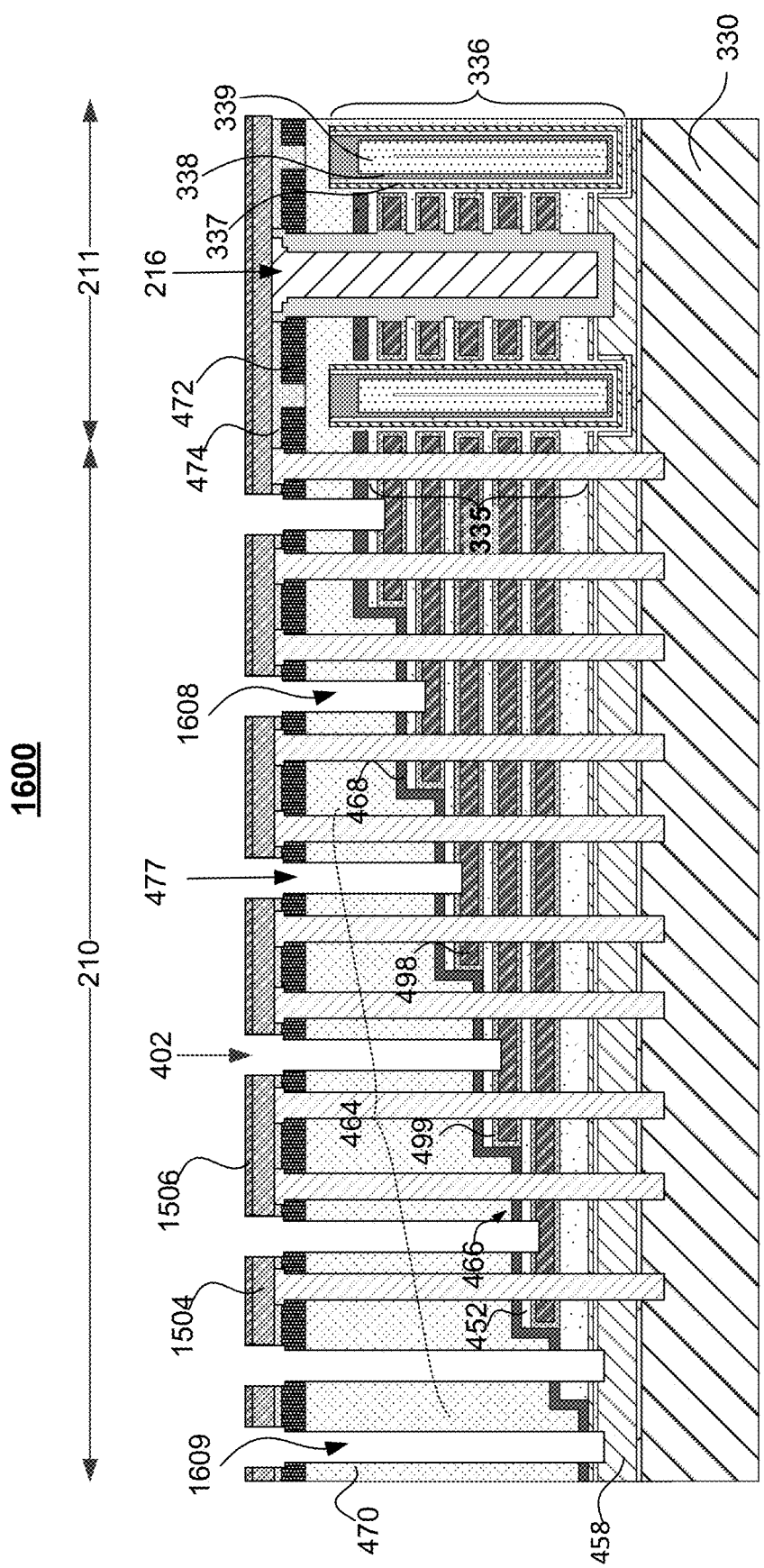
FIG. 16 illustrates a cross-sectional view of the 3D memory device in FIG. 4A at certain process step, according to some embodiments of the present disclosure.

As shown in FIG. 16, the 3D memory structure 1600 includes a plurality of SSCT openings 1608 penetrating vertically through the insulating layer 470 and exposing the conductive layers 498. In some embodiments, the SSCT openings 1608 also penetrates through the barrier layer 468. In some embodiments, the SSCT openings 1608 penetrates through the gate dielectric layer 499 on top of the conductive layer 498. In FIG. 16, one SSCT openings 1608 is shown for each staircase step 466, which is only for illustrative purpose. Multiple SSCTs openings 1608 can be formed on each staircase step 466.

The 3D memory structure 1600 also includes a plurality of ACS openings 1609, penetrating vertically through the insulating layer 470 and exposing the semiconductor layers 458. In some embodiments, the ACS openings 1609 extend further into the substrate 330.

As discussed previously, the third set of openings can also be formed in the peripheral region 105 for peripheral devices (not shown in FIG. 16). Accordingly, contact openings for peripheral devices, e.g., gates and/or sources/drains for CMOS devices can also be formed simultaneously as the SSCT openings 1608 and ACS openings 1609. The contact openings for peripheral devices can be formed using similar techniques as the SSCT openings 1608 and ACS openings 1609, which will be discussed in detail below.

The SSCT openings 1608 and the ACS openings 1609 can be formed by a suitable etching process, for example, dry etching, wet etching, or a combination thereof.

The forming of the SSCT openings 1608 and the ACS openings 1609 includes etching through portions of the sacrificial hard mask 474 exposed inside the third set of openings 402 so as to transfer the third set of openings 402 into the sacrificial hard mask 474 and expose the third set of patterns 477. Next, the insulating layer 470 can be etched using the SSCT resist mask 1506, the SSCT hard mask 1504, the sacrificial hard mask 474 and the embedded hard mask 472. The forming of the SSCT openings 1608 and the ACS openings 1609 can also include etching through the barrier layer 468. The etching processes used to form the SSCT openings 1608 and the ACS openings 1609 can include dry etching, wet etching, and/or a combination thereof. In some embodiments, the etching processes for the SSCT openings 1608 and the ACS openings 1609 include an anisotropic etching such as RIE. Similar to the etching processes for DCHs, the etching processes for SSCT openings 1608 and the ACS openings 1609 can also be a selective etching process such that etching rates of the insulating layer 470 can be much higher than the SSCT resist mask 1506, the SSCT hard mask 1504, the sacrificial hard mask 474 and the embedded hard mask 472. Accordingly, minimum erosion takes place in the SSCT resist mask 1506, the SSCT hard mask 1504, the sacrificial hard mask 474 and the embedded hard mask 472. Likewise, the SSCT openings 1608 and the ACS openings 1609 can be formed by relying on the embedded hard mask 472 when etching through the insulating layer 470 where the SSCT resist mask 1506, the SSCT hard mask 1504 and/or the sacrificial hard mask 474 can be eroded away during the etching process. In the other words, the SSCT openings 1608 and the ACS openings 1609 can be formed by relying on the portion of the embedded hard mask 472 exposed inside the third set of openings 402, where the CDs of the third set of patterns 477 can be smaller than the CDs of the third set of openings 402. Similarly, overlay tolerance between the third set of openings 402 and the third set of patterns 477 can also be relaxed such that a slight miss-alignment does not affect the forming of the SSCT openings 1608 and the ACS openings 1609, as long as the portions of the sacrificial hard mask 474 inside the third set of patterns 477 can be removed prior to the etching of the insulating layer 470.

Due to the topology of the staircase structure 464, depth of the SSCT openings 1608 depends on the location of the staircase steps 466. The SSCT openings 1608 of lower staircase steps can be much deeper than the SSCT openings 1608 of upper staircase steps. Therefore, the SSCT openings 1608 for the staircase steps 466 closer to the substrate 330 requires longer etch time than the SSCT openings 1608 for the staircase steps 466 further away from the substrate 330. A selective etching process can be used where the etching rate of the insulating layer 470 can be higher than the conductive layer 498 and/or the barrier layer 468. In some embodiments, during the etching process for SSCT openings 1608 and the ACS openings 1609, the barrier layer 468 can function as an etch-stop layer and can protect the underlying structure until all the SSCT openings 1608 and the ACS openings 1609 are formed on top of the barrier layer 468 for all staircase steps 466.

Referring to FIG. 5, at process step S580, a fourth set of openings can be formed for bit line contacts (BLCTs). A cross-sectional view of an exemplary 3D memory structure 1700 is shown in FIG. 17, according to the process step S580.

Figure 17:
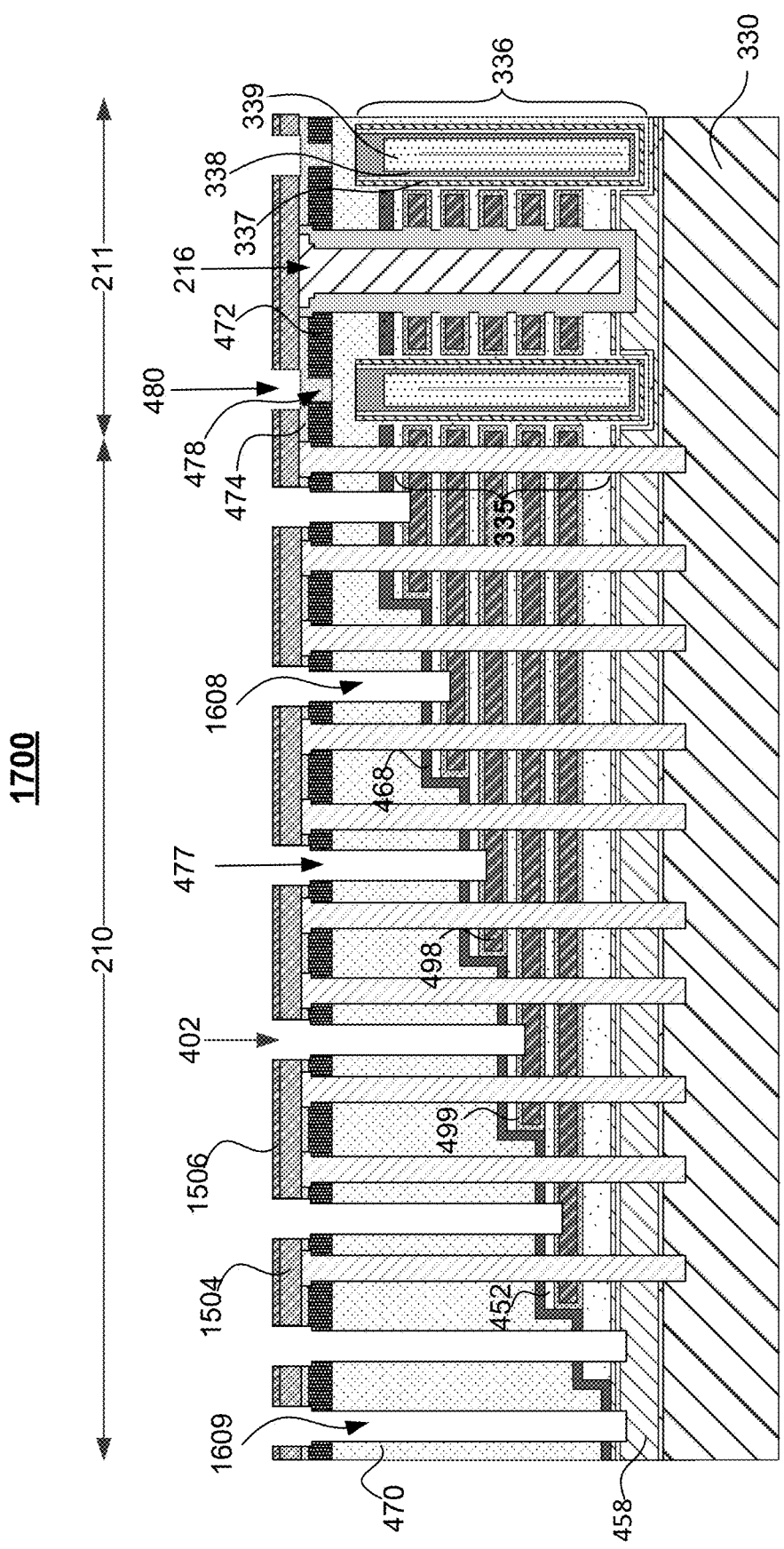
FIG. 17 illustrates a cross-sectional view of the 3D memory device in FIG. 4A at certain process step, according to some embodiments of the present disclosure.

As shown in FIG. 17, the 3D memory structure 1700 includes a fourth set of openings 480 formed over the channel holes 336. The fourth set of openings 480 are designed to form bit line (BL) contacts in subsequent processes. The fourth set of openings 480 can be formed by directly patterning the SSCT resist mask 1506 and the SSCT hard mask 1504.

The fourth set of openings 480 can be substantially aligned with the fourth set of patterns 478 in the embedded hard mask 472. Similar to the first set of openings 484, the fourth set of openings 480 can have CDs larger than those of the fourth set of patterns 478. Like the DCHs formation, CDs of the fourth set of patterns 478 can be used to determine the CDs of the BL contacts instead of using the CDs of the fourth set of openings 480. Because the fourth set of patterns 478 in the embedded hard mask 472 have been formed previously and are covered and protected by the sacrificial hard mask 474, CDs, pitches, shapes of the fourth set of patterns 478 are not affected by any processes implemented prior to forming the BL contacts. Also, the SSCT hard mask 1504 can have a reduced thickness because the embedded hard mask 472 and the sacrificial hard mask 474 can serve as additional mask for subsequent etching process. The fourth set of patterns 478 can be more visible during lithography process. As such, the overlay from the fourth set of openings 480 to the fourth set of patterns 478 can be controlled to a target tolerance range.

Referring to FIG. 5, at process step S585, a plurality of BLCT openings can be formed through the fourth set of openings. A cross-sectional view of an exemplary 3D memory structure 1800 is shown in FIG. 18, according to the process step S585.

Figure 18:
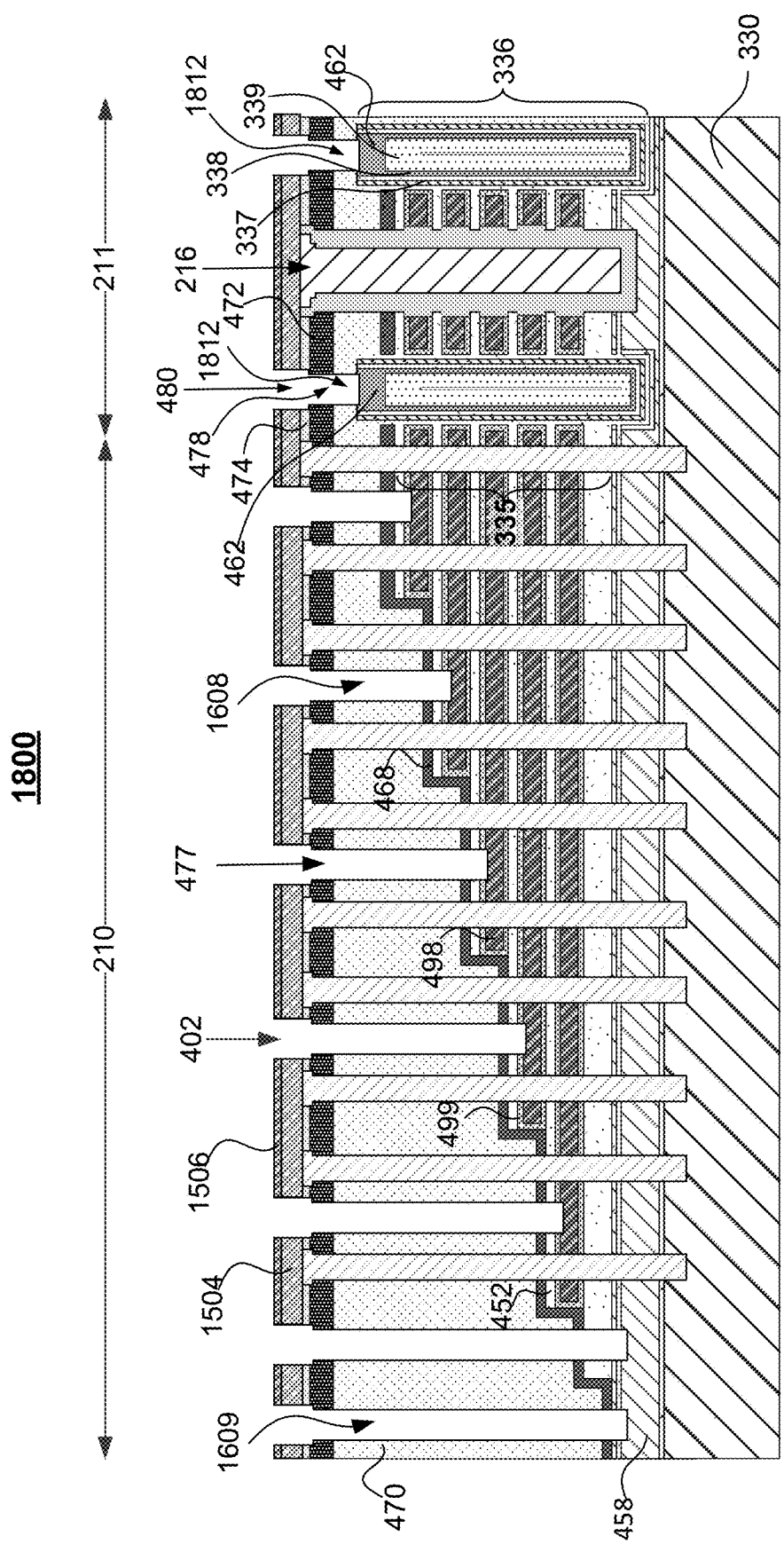
FIG. 18 illustrates a cross-sectional view of the 3D memory device in FIG. 4A at certain process step, according to some embodiments of the present disclosure.

As shown in FIG. 18, the 3D memory structure 1800 includes a plurality of BLCT openings 1812 penetrating vertically through the insulating layer 470 and exposing the top contact structure 462. The BLCT openings 1812 can be formed by a suitable etching process, for example, dry etching, wet etching, or a combination thereof.

The forming of the BLCT openings 1812 includes etching through portions of the sacrificial hard mask 474 exposed inside the fourth set of openings 480 such that the fourth set of openings 480 can be transferred into the sacrificial hard mask 474 and the fourth set of patterns 478 in the embedded hard mask 472 can be exposed. The insulating layer 470 can then be etched using the SSCT resist mask 1506, SSCT hard mask 1504, the sacrificial hard mask 474 and the embedded hard mask 472. The etching processes used to form the BLCT openings 1812 can include dry etching, wet etching, and/or a combination thereof. In some embodiments, the etching processes for the BLCT openings 1812 include an anisotropic etching such as RIE. Similar to the etching processes for DCHs, the etching processes for BLCT openings 1812 can also be a selective etching process such that etching rate of the insulating layer 470 is much higher than the SSCT resist mask 1506, the SSCT hard mask 1504, the sacrificial hard mask 474 and the embedded hard mask 472. Accordingly, minimum erosion takes place in the SSCT resist mask 1506, the SSCT hard mask 1504, the sacrificial hard mask 474 and the embedded hard mask 472. Likewise, the BLCT openings 1812 can be formed by relying on the embedded hard mask 472 when etching through the insulating layer 470, where the SSCT resist mask 1506, the SSCT hard mask 1504 and/or the sacrificial hard mask 474 can be eroded away during the etching process. In the other words, the BLCT openings 1812 can be formed by relying on the portion of the embedded hard mask 472 exposed inside the fourth set of openings 480, where the CDs of the fourth set of patterns 478 can be smaller than the CDs of the fourth set of openings 480. Similarly, overlay tolerance between the fourth set of openings 480 and the fourth set of patterns 478 can also be relaxed such that a slight missalignment does not affect the forming of the BLCT openings 1812, as long as the portions of the sacrificial hard mask 474 inside the fourth set of patterns 478 can be removed prior to the etching of the insulating layer 470.

Referring to FIG. 5, at process step S590, conductive cores can be disposed inside the BLCT openings, SSCT openings and ACS openings to form BL contacts (BLCT), staircase contacts (SSCT) and ACS contacts, respectively. A cross-sectional view of an exemplary 3D memory structure 1900 is shown in FIG. 19, according to the process step S590.

Figure 19:
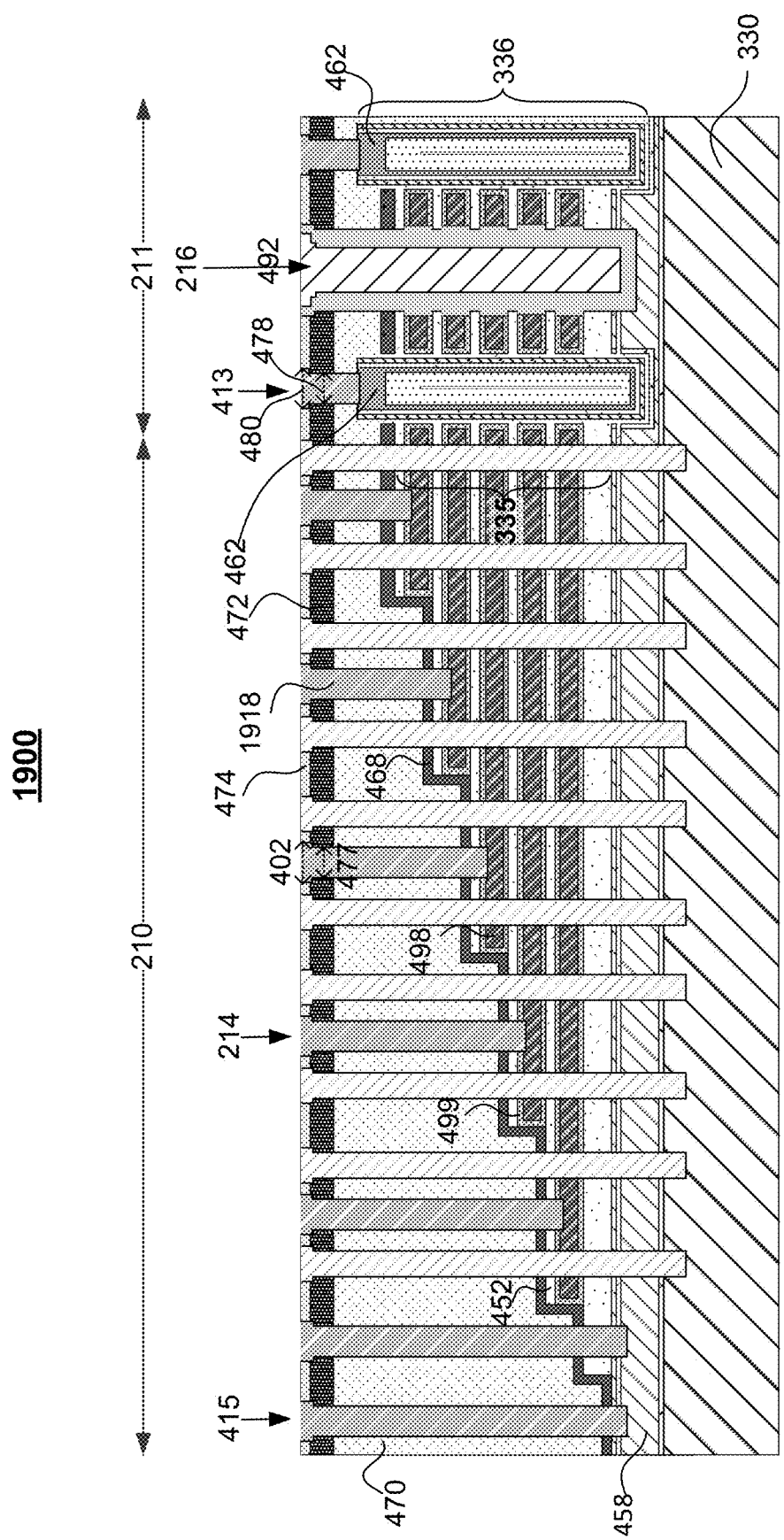
FIG. 19 illustrates a cross-sectional view of the 3D memory device in FIG. 4A at certain process step, according to some embodiments of the present disclosure.

As shown in FIGS. 18 and 19, a conductive material can be disposed over the 3D memory structure 1800 after stripping off the SSCT resist mask 1506 and SSCT HM 1504 to form conductive cores 1918 inside the BLCT openings 1812, SSCT openings 1608, and ACS openings 1609. The conductive cores 1918 can contact the conductive layers 498 to form SSCTs 214 (i.e., SSCTs 214 in FIGS. 2 and 3) in the staircase region 210. The conductive cores 1918 can also contact the semiconductor layer 458 or the substrate 330 to form the ACS contacts 415. The conductive cores 1918 can also contact the top contact structure 462 to form the BLCTs 413 in the channel structure region 211.

The conductive core 1918 can include any suitable conductive material. The conductive core 1918 can include metal, metal alloy and/or metal silicide, for example, tungsten, titanium, tantalum, tungsten nitride, titanium nitride, tantalum nitride, nickel silicide, cobalt silicide, tungsten silicide, titanium silicide, or a combination thereof. The conductive core 1918 can be deposited by CVD, PVD, ALD, evaporation, sputtering, etc. In some embodiments, the conductive core 1918 can be tungsten deposited by CVD.

In some embodiments, a planarization process, such as CMP, can be used to remove any conductive materials outside the BLCT openings 1812, the SSCT openings 1608 and the ACS openings 1609.

As discussed previously, the third set of openings and contact openings can also be formed in the peripheral region 105 for peripheral devices. In this example, conductive cores 1918 can also be disposed inside the contact openings to form contacts for the peripheral devices in the peripheral region.

It is noted that new resist/hard mask can be used to form the fourth set of openings 480 and the BLCT openings 1812. In this example, the SSCT resist mask 1506 and the SSCT hard mask 1504 can be stripped and the SSCT 214/ACS contacts 415 can be formed first prior to patterning the new resist/hard mask for the fourth set of openings 480.

As discussed previously, critical dimensions of SSCTs 214 and ACS contacts 415 can be determined by the third set of patterns 477 in the embedded hard mask 472. Critical dimension of BLCTs 413 can be determined by the fourth set of patterns 478 in the embedded hard mask 472. The third set of openings 402 and the fourth set of openings 480 can be transferred into the sacrificial hard mask 474 with CDs larger than respective CD of the third set of patterns 477 and the fourth set of patterns 478. Accordingly, the SSCTs 214 and the ACS contacts 415 can have also "T" shapes, where the heads of the "T" shapes located inside the sacrificial hard mask 474.

In summary, the present disclosure provides a method for forming a three-dimensional (3D) memory device. The method includes forming an alternating dielectric stack on a substrate, wherein the alternating dielectric stack includes a plurality of dielectric layer pairs, each dielectric layer pair comprising a first dielectric layer and a second dielectric layer different from the first dielectric layer. The method also includes forming a staircase structure in the alternating dielectric stack and disposing an insulating layer on the staircase structure and the alternating dielectric stack. The method further includes forming an embedded hard mask on the insulating layer, wherein the embedded hard mask includes two or more sets of patterns configured to form two or more sets of vertical structures that are fabricated sequentially. The two or more sets of patterns are embedded in the 3D memory device.

The present disclosure also provides a three-dimensional (3D) memory device. The 3D memory device includes a film stack of alternating conductive and dielectric layers, having conductive layers and dielectric layers alternatingly stacked on a substrate. The 3D memory device also includes a staircase structure formed in the film stack, an insulating layer disposed over the staircase structure and the film stack; and an embedded hard mask disposed on the insulating layer and comprising multiple sets of patterns, wherein the two or more sets of patterns determine critical dimensions of two or more sets of vertical structures extending perpendicularly to the substrate. The two or more sets of patterns are embedded in the 3D memory device. In some embodiments, the 3D memory device includes a sacrificial hard mask disposed on the embedded hard mask.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a three-dimensional (3D) memory device, comprising:
   forming an alternating dielectric stack on a substrate, wherein the alternating dielectric stack comprises a plurality of dielectric layer pairs, each dielectric layer pair comprising a first dielectric layer and a second dielectric layer different from the first dielectric layer;
   forming a staircase structure in the alternating dielectric stack;
   disposing an insulating layer on the staircase structure and the alternating dielectric stack; and
   forming an embedded hard mask on the insulating layer, wherein:
      the embedded hard mask comprises two or more sets of patterns configured to form two or more sets of vertical structures that are fabricated sequentially, the two or more sets of vertical structures including a set of bit line (BL) contacts and a set of staircase (SS) contacts, each of the BL contacts and the set of SS contacts formed using the embedded hard mask; and
      the two or more sets of patterns are embedded in the 3D memory device.

2. The method of claim 1, wherein the forming the embedded hard mask comprises:
   disposing a first dielectric material on the insulating layer; and
   etching the first dielectric material to form the two or more sets of patterns.

3. The method of claim 2, further comprising:
   forming a sacrificial hard mask on the embedded hard mask, wherein the sacrificial hard mask comprises a second dielectric material different from the first dielectric material.

4. The method of claim 3, wherein the forming the sacrificial hard mask comprises:
   disposing the second dielectric material on the embedded hard mask; and
   planarizing the second dielectric material to form a planar surface for the sacrificial hard mask.

5. The method of claim 3, further comprising:
   forming the two or more sets of vertical structures, wherein the forming the two or more sets of vertical structures comprises:
      etching, sequentially, the sacrificial hard mask to form two or more sets of openings successively, wherein the two or more sets of openings are aligned with the two or more sets of patterns in the embedded hard mask and the two or more sets of openings are wider than corresponding two or more sets of patterns.

6. The method of claim 5, wherein the forming the two or more sets of vertical structures further comprises:
   forming two or more sets of vertical openings in the insulating layer, wherein:
      the two or more sets of vertical openings are perpendicular to the substrate; and
      critical dimensions of the two or more sets of vertical openings are determined by the two or more sets of patterns in the embedded hard mask.

7. The method of claim 6, wherein the forming the two or more sets of vertical structures further comprises forming a set of dummy channel holes (DCHs), comprising:
   etching the sacrificial hard mask to form a first set of openings, wherein:
      the first set of openings are aligned with a first set of patterns among the two or more sets of patterns in the embedded hard mask; and
      the first set of openings in the sacrificial hard mask are wider than the first set of patterns in the embedded hard mask;

forming a set of DCH openings among the two or more sets of vertical openings by etching through the insulating layer, the staircase structure and a portion of the substrate; and disposing an insulating material inside the set of DCH openings.

8. The method of claim 7, wherein the forming the set of DCHs further comprises:
disposing a DCH resist mask and a DCH hard mask on the sacrificial hard mask; and
patterning the DCH resist mask and the DCH hard mask to form the set of DCH openings.

9. The method of claim 8, wherein the DCH hard mask comprises a thickness in a range between 10 nm to 50 nm.

10. The method of claim 6, wherein the forming the two or more sets of vertical structures further comprises forming a set of gate line slits (GLSs), comprising:
etching the sacrificial hard mask to form a second set of openings, wherein:
the second set of openings are aligned with a second set of patterns among the two or more sets of patterns in the embedded hard mask; and
the second set of openings in the sacrificial hard mask are wider than the second set of patterns in the embedded hard mask;
forming a set of GLS openings among the two or more sets of vertical openings by etching through the alternating dielectric stack;
replacing the second dielectric layers in the alternating dielectric stack with conductive layers to form a film stack of alternating conductive and dielectric layers; and
disposing an insulating material inside the set of GLS openings.

11. The method of claim 10, wherein forming the set of SS contacts, comprises:
etching the sacrificial hard mask to form a third set of openings, wherein:
the third set of openings are aligned with a third set of patterns among the two or more sets of patterns in the embedded hard mask; and
the third set of openings in the sacrificial hard mask are wider than the third set of patterns in the embedded hard mask;
forming a set of SS contact openings among the two or more sets of vertical openings, comprising:
etching through the insulating layer selectively to a barrier layer disposed on the staircase structure; and
etching through the barrier layer to expose the conductive layers; and disposing a conductive material inside the set of SS contact openings.

12. The method of claim 11, wherein the forming the two or more sets of vertical structures further comprises forming a set of array common source (ACS) contacts, comprising:
forming a set of ACS contact openings among the two or more sets of vertical openings by etching into the substrate or a semiconductor layer disposed on the substrate; and
disposing the conductive material inside the set of ACS contact openings.

13. The method of claim 11, wherein forming the set of BL contacts, comprises:
etching the sacrificial hard mask to form a fourth set of openings, wherein:
the fourth set of openings are aligned with a fourth set of patterns among the two or more sets of patterns in the embedded hard mask; and
the fourth set of openings in the sacrificial hard mask are wider than the fourth set of patterns in the embedded hard mask;
forming a set of BL contact openings among the two or more sets of vertical openings by etching through the insulating layer and exposing top contact structures on top portions of a plurality of channel holes; and
disposing the conductive material inside the set of BL contact openings.

14. The method of claim 13, further comprising:
forming the plurality of channel holes penetrating vertically through the alternating dielectric stack, comprising:
disposing memory films on sidewalls of the plurality of channel holes;
disposing channel layers on sidewalls of the memory films; and
disposing core filling films on sidewalls of the channel layers.

15. The method of claim 14, wherein forming the plurality of channel holes further comprises:
disposing a lower alternating dielectric stack on the substrate;
forming a plurality of lower channel holes in the lower alternating dielectric stack;
disposing an upper alternating dielectric stack on the lower alternating dielectric stack; and
forming a plurality of upper channel holes in the upper alternating dielectric stack, wherein the plurality of upper channel holes are aligned with the plurality of lower channel holes.

* * * * *